(12) United States Patent
Yang

(10) Patent No.: US 11,737,255 B2
(45) Date of Patent: *Aug. 22, 2023

(54) MEMORY DEVICE AND METHOD FOR FORMING THEREOF

(71) Applicant: Taiwan Semiconductor Manufacturing Co., Ltd., Hsinchu (TW)

(72) Inventor: Chih-Chuan Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/651,834

(22) Filed: Feb. 21, 2022

(65) Prior Publication Data

US 2022/0173113 A1 Jun. 2, 2022

Related U.S. Application Data

(63) Continuation of application No. 16/941,784, filed on Jul. 29, 2020, now Pat. No. 11,257,824.

(51) Int. Cl.
 *H10B 10/00* (2023.01)
 *H01L 23/528* (2006.01)
 *H01L 27/092* (2006.01)

(52) U.S. Cl.
 CPC ......... *H10B 10/12* (2023.02); *H01L 23/5286* (2013.01); *H01L 27/0924* (2013.01)

(58) Field of Classification Search
 CPC ............. H01L 27/1104; H01L 23/5286; H01L 27/0924; H01L 27/0207; H01L 27/1116; H10B 10/12; H10B 10/18; G11C 11/412; G11C 11/417; G11C 5/025
 See application file for complete search history.

(56) References Cited

U.S. PATENT DOCUMENTS

| | | | |
|---|---|---|---|
| 8,605,523 | B2 | 12/2013 | Tao et al. |
| 8,630,132 | B2 | 1/2014 | Cheng et al. |
| 8,760,948 | B2 | 6/2014 | Tao et al. |
| 9,455,028 | B1 | 9/2016 | Sahu |
| 10,468,418 | B2 * | 11/2019 | Chen ................... H01L 27/1116 |
| 2009/0067220 | A1 | 3/2009 | Asayama |
| 2014/0032871 | A1 | 1/2014 | Hsu et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |
| 2016/0306910 | A1 * | 10/2016 | Tseng ...................... G06F 30/39 |
| 2017/0110182 | A1 | 4/2017 | Liaw |
| 2017/0221552 | A1 | 8/2017 | Liaw |
| 2018/0151553 | A1 | 5/2018 | Liaw |

(Continued)

*Primary Examiner* — Karen Kusumakar
*Assistant Examiner* — Adam S Bowen
(74) *Attorney, Agent, or Firm* — Slater Matsil, LLP

(57) ABSTRACT

A semiconductor device includes a first memory cell and a dummy region adjacent to the first memory cell. The first memory cell includes a first transistor. The dummy region includes a cut-off transistor. The cut-off transistor has a first terminal electrically coupled to a second terminal of the first transistor. The cut-off transistor has a third terminal electrically coupled to ground.

20 Claims, 23 Drawing Sheets

(56) References Cited

U.S. PATENT DOCUMENTS

2018/0175046 A1    6/2018  Chiou et al.
2018/0337189 A1*  11/2018  Chen ...................... H10B 10/18
2020/0027869 A1*  1/2020  Yeh ........................ H10B 10/12

* cited by examiner

MEMORY DEVICE AND METHOD FOR FORMING THEREOF

PRIORITY CLAIM AND CROSS-REFERENCE

This application is a continuation of U.S. patent application Ser. No. 16/941,784, filed on Jul. 29, 2020, and entitled, "Memory Device and Method for Forming Thereof," now U.S. Pat. No. 11,257,824 issued Feb. 22, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature sizes, which allow more components to be integrated into a given area. However, as the minimum feature sizes are reduced, additional problems arise that should be addressed.

Static random access memory (SRAM) is commonly used in integrated circuits. SRAM cells have the advantageous feature of holding data without a need for refreshing. With the increasing speed requirements of integrated circuits, the read speed and write speed of SRAM cells also become more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
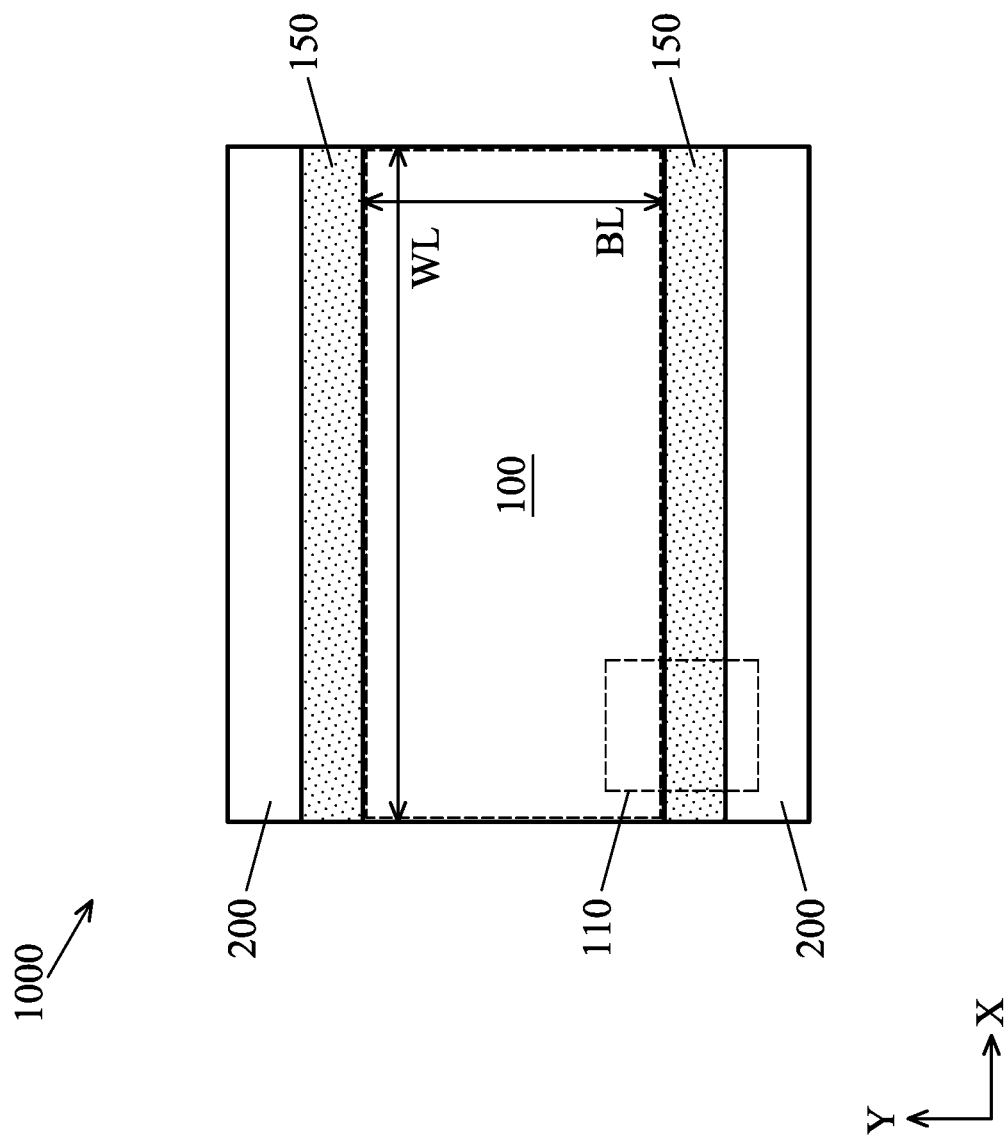
FIG. 1 illustrates a portion of a semiconductor wafer comprising an SRAM cell array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) cells are provided in accordance with various embodiments. Some variations of some embodiments are discussed. Throughout the various views and illustrative embodiments, like reference numbers are used to designate like elements formed using like processes. Furthermore, although various embodiments are described in a particular context of SRAM layouts, other embodiments may also be applied to other memory cell configurations, such as read only memory (ROM) cells, dynamic random access memory (DRAM) cells, magnetic random access memory (MRAM) cells, phase change random access memory (PRAM) cells, and resistive random access memory (RRAM) cells.

Embodiments disclosed below may reduce the standby leakage from SRAM circuits. Generally, as the size of SRAM circuit designs continues to shrink, the issue of standby leakage out of SRAM circuits may increase in salience. The majority of the standby leakage out of SRAM circuits comes from subthreshold channel current. For SRAM circuit designs with smaller transistor sizes and lower threshold voltages, it may be difficult to reduce the standby leakage from subthreshold channel current. In order to reduce standby leakage, embodiments may include a switchable high resistance path between the SRAM cell and the power supply voltage Vss. The high resistance path may be one or more transistors formed in dummy regions on the edges of the SRAM arrays electrically interposed between the SRAM cells and the power supply voltage Vss (which may be electrical ground). The transistors in the dummy regions may function as resistors when in standby mode, thereby limiting or reducing the leakage current, and pass current in a low resistance state when in an active mode. In some embodiments, standby current can be reduced by, for example, about 70% in comparison to a design without transistors in the dummy regions connecting to Vss. Embodiments of SRAM array designs with transistors in the dummy regions may achieve better results without impacting read/write ability due to shorter bit-line loading from a smaller array size achieved by taking advantage of the dummy regions.

FIG. 1 illustrates an SRAM array 1000 comprising a memory region 100, P-well/N-well (PW/NW) pickup regions 200 on opposite sides of the memory region 100, and dummy regions 150 disposed between the memory region 100 and the PW/NW pickup regions 200. The dummy regions 150 may provide space to connect the SRAM cells in the memory region 100 with the PW/NW pickup regions 200 and provide a buffer space between the SRAM cells and the edges of the SRAM array 1000. In some embodiments, the dummy regions 150 comprise three dummy gates and/or a width equal to one or more dummy gates (e.g., a width equal to three dummy gate pitches) between the boundaries of the dummy regions 150 with the memory region 100 and the opposite boundaries of the dummy regions 150 with the PW/NW pickup regions 150. In some embodiments, the dummy regions 150 comprise less than three dummy gates, such as two dummy gates, or more than three dummy gates, such as four or five dummy gates. Region 110 denotes an area in which a reference layout will be discussed in greater detail, such as the discussion below with reference to, e.g., FIGS. 7A-7F and 8A-8F.

The SRAM array 1000 is formed on a substrate which may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer or a single die (e.g., processed in a wafer and then removed from other devices of the wafer using a singulation process).

Figure 2A:
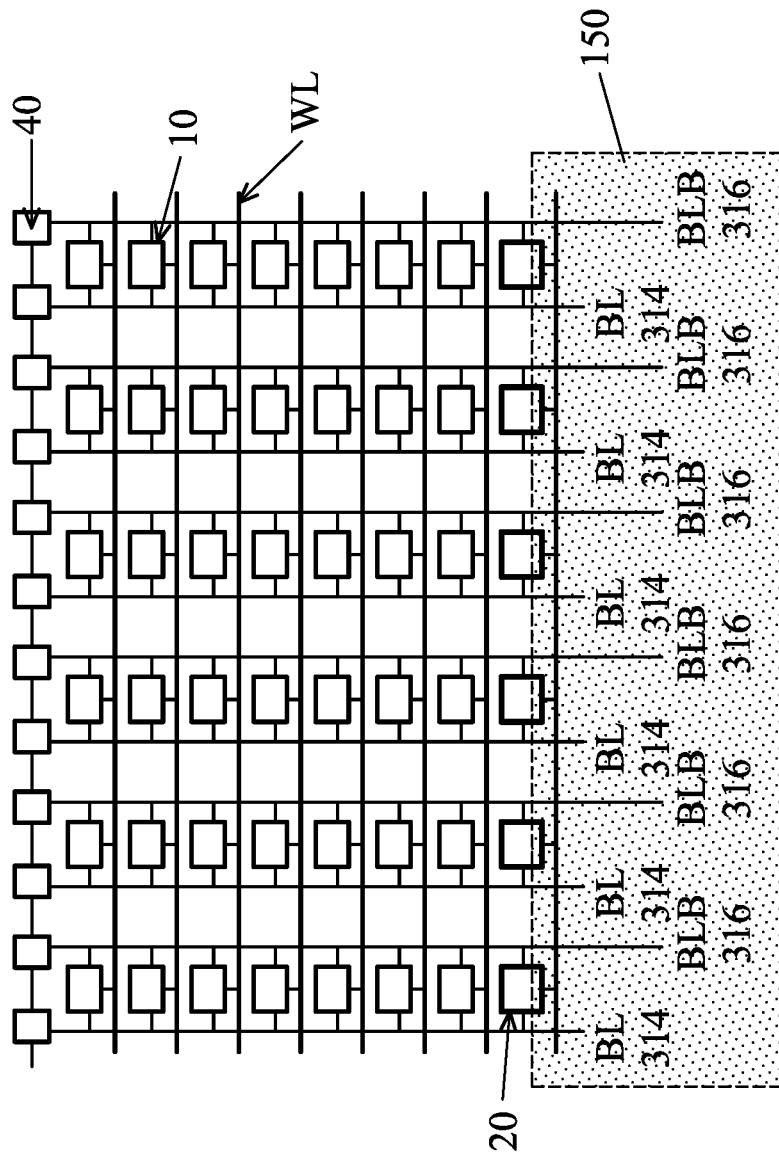
FIG. 2A illustrates a diagram of an SRAM array in accordance with some embodiments.
Figure 2B:
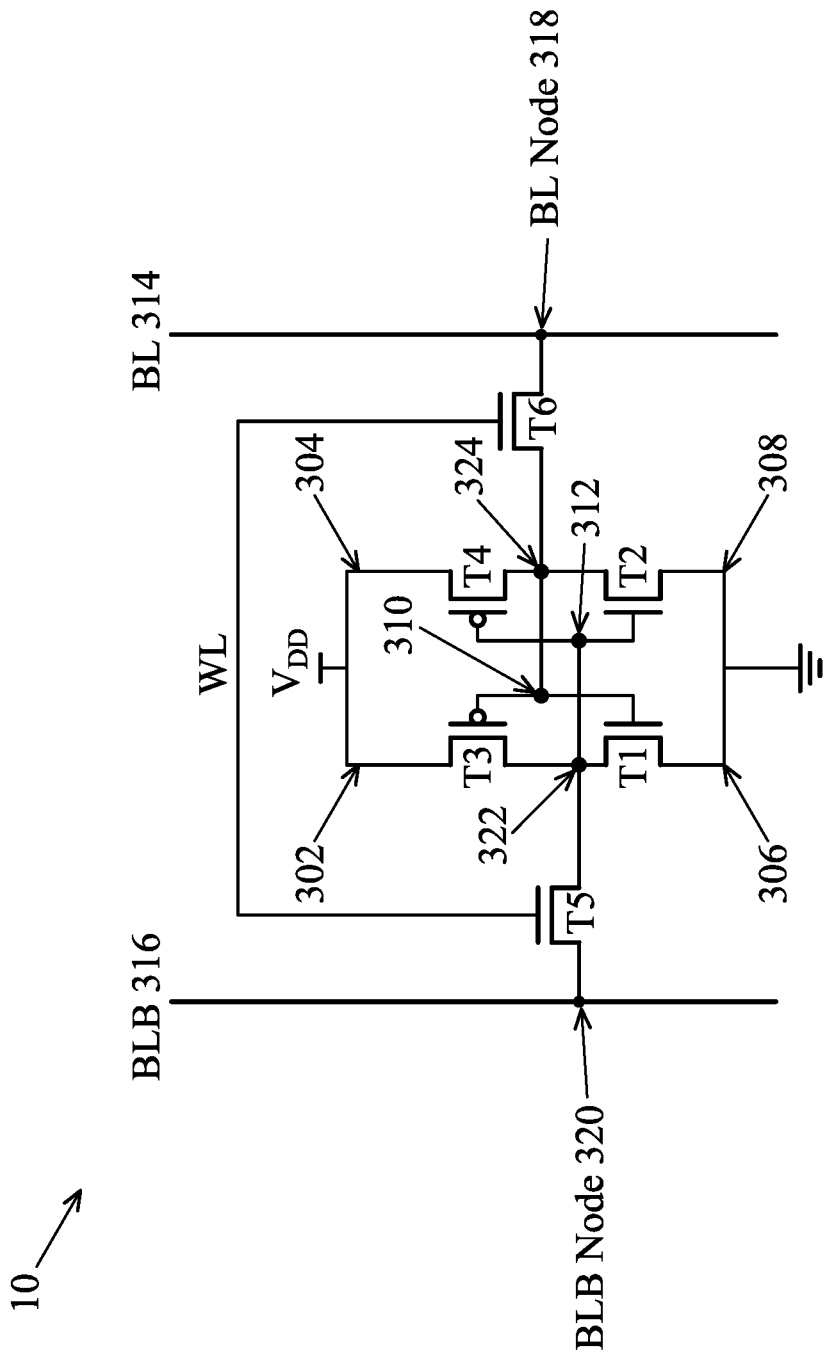
FIGS. 2B and 2C illustrate circuit diagrams of static random access memory (SRAM) cells in accordance with some embodiments.
Figure 2C:
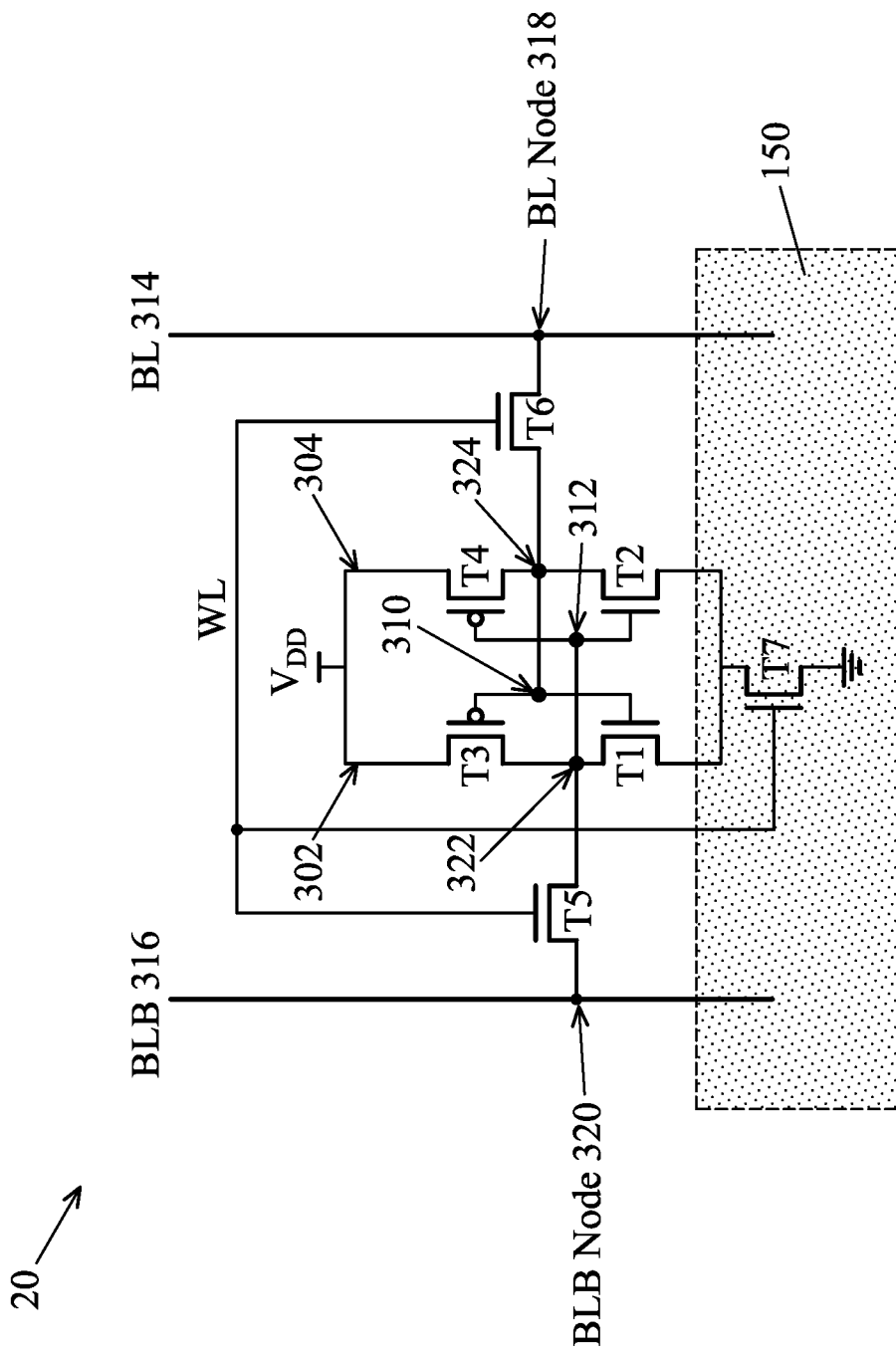

FIGS. 2A-2C illustrates a first memory array layout in accordance with some embodiments. As will be discussed in greater detail below, embodiments such as illustrated in FIGS. 2A-2C provide a memory array wherein a memory cell adjacent to the dummy region 150 are connected to a power supply voltage Vss through a cut-off transistor. Other memory cells in the memory array may be connected to the power supply voltage Vss without passing through the cut-off transistor. In this manner, the memory cell along the boundary with the dummy region 150 has a high resistance path to the power supply voltage Vss, which may reduce leakage along the memory array boundary while avoiding a high resistance issue with the Vss power. In some embodiments, SRAM array 1000 comprises a word line loading of 128 bits through word lines WL and a bit line loading of 64 bits through bit lines BL for a total storage capacity of 8 kilobits. Using 128 SRAM cells 20 down the word lines WL along the borders of each of the dummy regions 150, the standby leakage current of 128 times 2 bits (256 bits) of the 8 Kb of the SRAM array 1000 can be reduce by, for example, about 3%.

Referring now to FIG. 2A, an SRAM array comprising SRAM cells 10 and 20, respectively, is illustrated. SRAM cells 10 are positioned along an interior region of the memory array, and SRAM cells 20 are positioned along an interface between the memory array and the boundary region 150. Drivers 40 are connected to vertical BLs 314 and BLBs 316. Each SRAM cell 10 and each SRAM cell 20 in each column of the SRAM array is electrically connected to one BL 314 and one BLB 316. Each SRAM cell 10 and each SRAM cell 20 in each row of the SRAM array is connected to one horizontal word line WL.

FIG. 2B illustrates a circuit diagram of SRAM cell 10, in accordance with some embodiments. As illustrated in FIGS. 1 and 2A, SRAM cell 10 is a memory cell in the memory array 100 (see FIG. 1) separated from an interface between the memory array 100 and the boundary region 150 (see FIG. 1). SRAM cell 10 includes pull-down (PD) transistors T1 and T2, which may be N-type Metal-Oxide-Semiconductor (NMOS) transistors, pull-up (PU) transistors T3 and T4, which may be P-type Metal-Oxide-Semiconductor (PMOS) transistors, and pass-gate (PG) transistors T5 and T6, which may be NMOS transistors. The gates of PG transistors T5 and T6 are controlled by a word line (WL) that determines whether SRAM cell 10 is selected or not. A latch formed of PU transistors T3 and T4 and PD transistors T1 and T2 stores a bit, wherein the complementary values of the bit are stored in storage data (SD) node 310 and SD node 312. The stored bit can be written into, or read from, SRAM cell 10 through complementary bit lines including bit line (BL) 314 and bit line bar (BLB) 316. SRAM cell 10 is powered through a positive power supply node Vdd that has a positive power supply voltage (also denoted as CVdd). SRAM cell 10 is also connected to power supply voltage Vss (also denoted as CVss). In some embodiments, Vss or CVss is an electrical ground. Transistors T3 and T1 form a first inverter, and transistors T4 and T2 form a second inverter. The input of the first inverter is connected to transistor T6 and the output of the second inverter at node 324. The output of the first inverter is connected to transistor T5 and the input of the second inverter at node 322.

The sources of PU transistors T3 and T4 are connected to CVdd node 302 and CVdd node 304, respectively, which are further connected to power supply voltage (and line) Vdd. The sources of PD transistors T1 and T2 are connected to CVss node 306 and CVss node 308, respectively, which are further connected to power supply voltage/line Vss. The gates of transistors T3 and T1 are connected to the drains of transistors T4 and T2, which form a connection node that is referred to as SD node 310. The gates of transistors T4 and T2 are connected to the drains of transistors T3 and T1, which connection node is referred to as SD node 312. A source/drain region of PG transistor T5 is connected to bit line BLB 316 at a BLB node 320. A source/drain region of PG transistor T6 is connected to bit line BL 314 at a BL node 318.

FIG. 2C illustrates a circuit diagram of the SRAM cell 20 illustrated in FIG. 2A, in accordance with some embodiments. As illustrated in FIGS. 1 and 2A, SRAM cell 20 is a memory cell in the memory array 100 (see FIG. 1) along an interface between the memory array 100 and the boundary region 150 (see FIG. 1). The circuit diagram of SRAM cell 20 is similar to the layout of SRAM cell 10, with source/drain regions of PD transistors T1 and T2 connected to a first source/drain region of an additional cut-off transistor T7, rather than to CVss node 306 and CVss node 308 as is the SRAM cell 10 of FIG. 2B. The cut-off transistor T7 may be an NMOS transistor. The second source/drain region of the cut-off transistor T7 is connected to the power supply voltage Vss. The gate of the cut-off transistor T7 is controlled by the word line WL of the row of memory cells adjacent to the boundary region 150. When the SRAM cell 20 is in standby mode and the WL is not asserted, the cut-off transistor T7 will be switched off and function as a high resistance. The leakage path of the transistors T1 or T2 to Vss through the cut-off transistor T7 may separate the voltage and reduce the standby leakage of the SRAM cell 20. The additional cut-off transistor T7 may be located in a dummy region of the SRAM array containing SRAM cell 20, so the cut-off transistor T7 may not need additional process steps to create or area to occupy in comparison with a design not including the cut-off transistor T7.

Figure 3A:
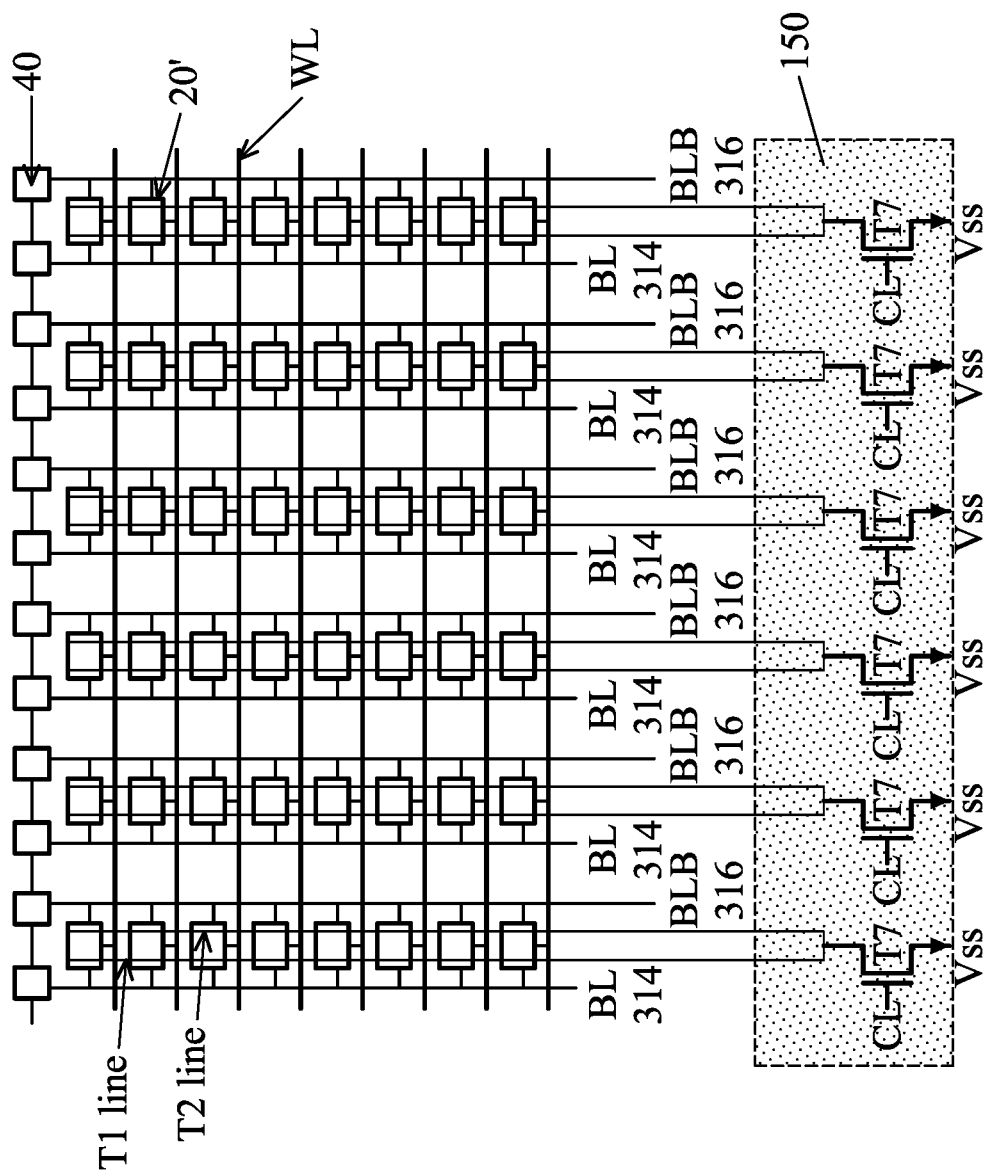
FIG. 3A illustrates a diagram of an SRAM array in accordance with some embodiments.
Figure 3B:
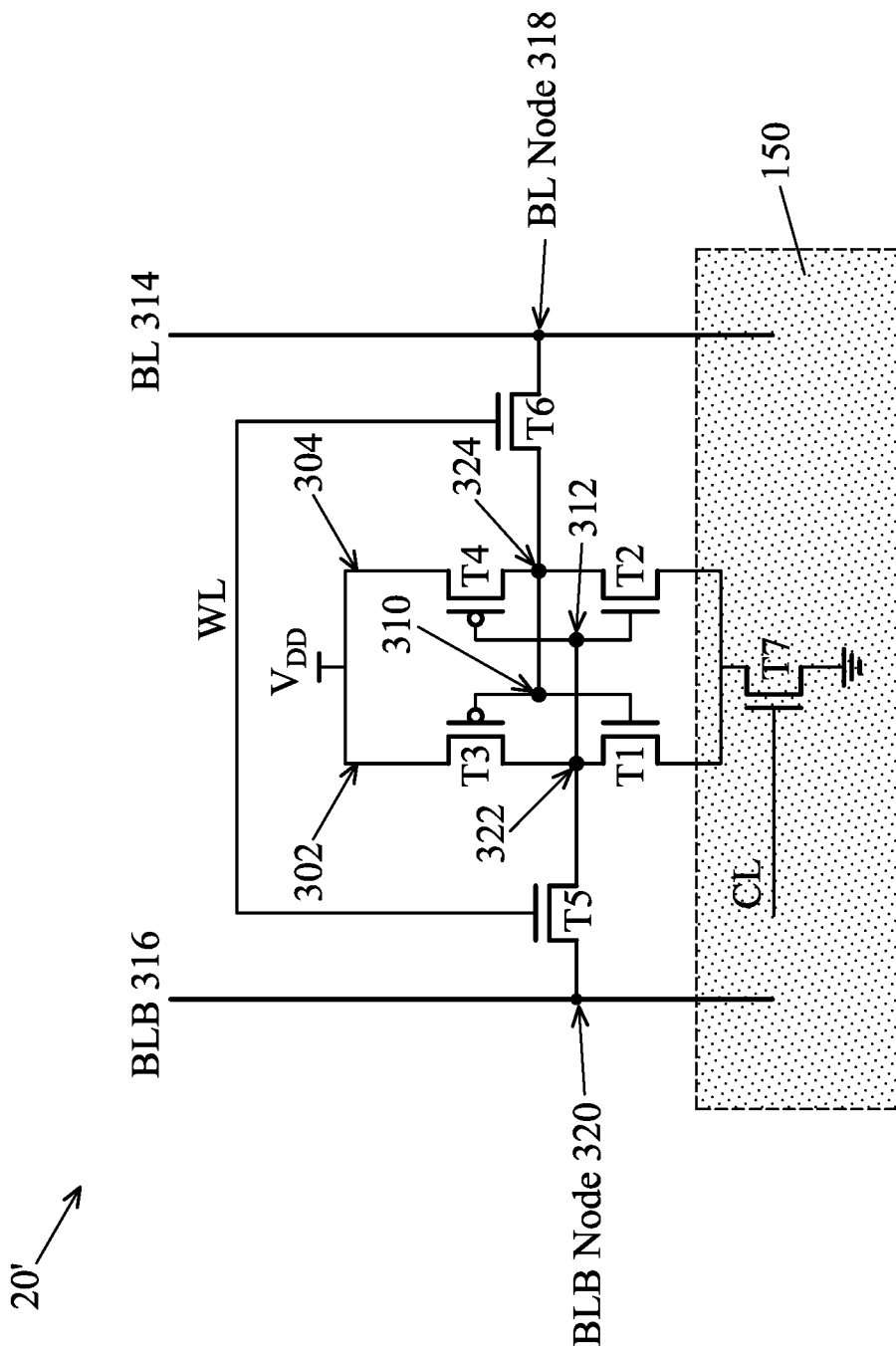
FIG. 3B illustrates a circuit diagram of an SRAM cell in accordance with some embodiments.

FIGS. 3A-3C illustrates a second memory array layout in accordance with some embodiments. As will be discussed in greater detail below, embodiments such as illustrated in FIGS. 3A-3C provide a memory array wherein the memory cells are connected to power supply voltage Vss through a cut-off transistor located in the dummy region 150. For example, a plurality of memory cells along a bit line may be connected to the power supply voltage through a single cut-off transistor in the dummy region 150, thereby allowing a high resistance path to be created between each of the memory cells and the power supply voltage Vss, thereby reducing leakage of the individual memory cells in standby mode. Using SRAM cells 20' (see FIG. 3B) in place of SRAM cells 10 may reduce SRAM standby leakage. Standby current may be reduced by about 70% compared to a design consisting of only SRAM cells 10 with six transistors or the like, because using SRAM cells 20', causes the standby current to be reduced by reducing or limiting leakage through the cut-off transistors T7 and/or T8.

Referring now to FIG. 3A, an SRAM array comprising SRAM cells 20' (see FIG. 3B) is illustrated. The sources of the PD transistors T1 and T2 of each SRAM cell 20' are connected to the first source/drain region(s) of one or more cut-off transistors T7 located outside the SRAM array in the dummy region 150. The second source/drain regions of the cut-off transistors T7 are connected to the power supply voltage Vss. The gates of the cut-off transistors T7 are controlled by respective control lines CL. In some embodiments, each column of SRAM cells 20' coupled to a single bit line is connected to cut-off transistor T7, and there is one cut-off transistor T7 for each column of the memory array or memory sub-array. In some embodiments, a control line CL controlling a gate of a cut-off transistor T7 in one column is connected to the BL and BLB of the respective column, and the control line CL may be configured to turn on the cut-off transistor T7 when an SRAM cell 20' in the same column and connected to the same respective BL and BLB is selected for reading and/or writing.

FIG. 3B illustrates a circuit diagram of the SRAM cell 20' of FIG. 3A in accordance with some embodiments. The circuit diagram of SRAM cell 20' is similar to the layout of SRAM cell 20 (see FIG. 2C), but with the cut-off transistor T7 connected to a separate control line CL instead of the word line WL. The cut-off transistor T7 may be located in the dummy region 150 of the SRAM array containing SRAM cell 20', so the cut-off transistor T7 may not need additional process steps to create or area to occupy in comparison with a design not including the cut-off transistor T7.

Figure 4A:
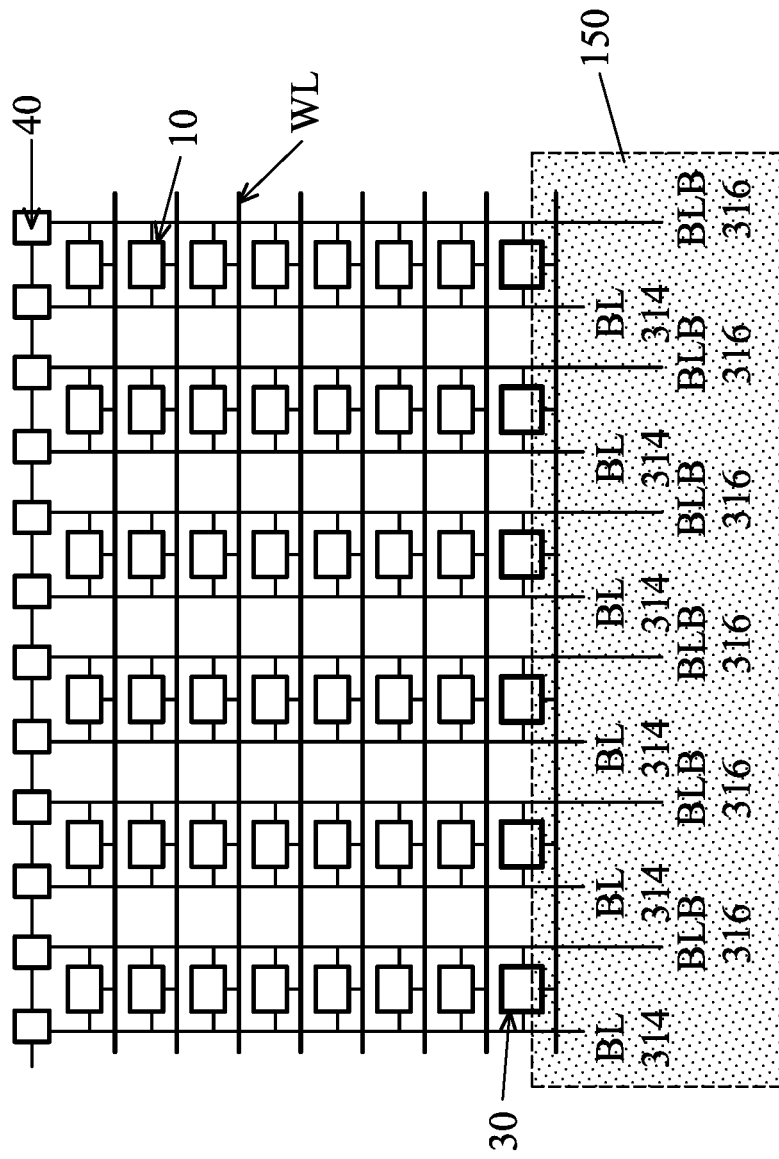
FIG. 4A illustrates a diagram of an SRAM array in accordance with some embodiments.
Figure 4B:
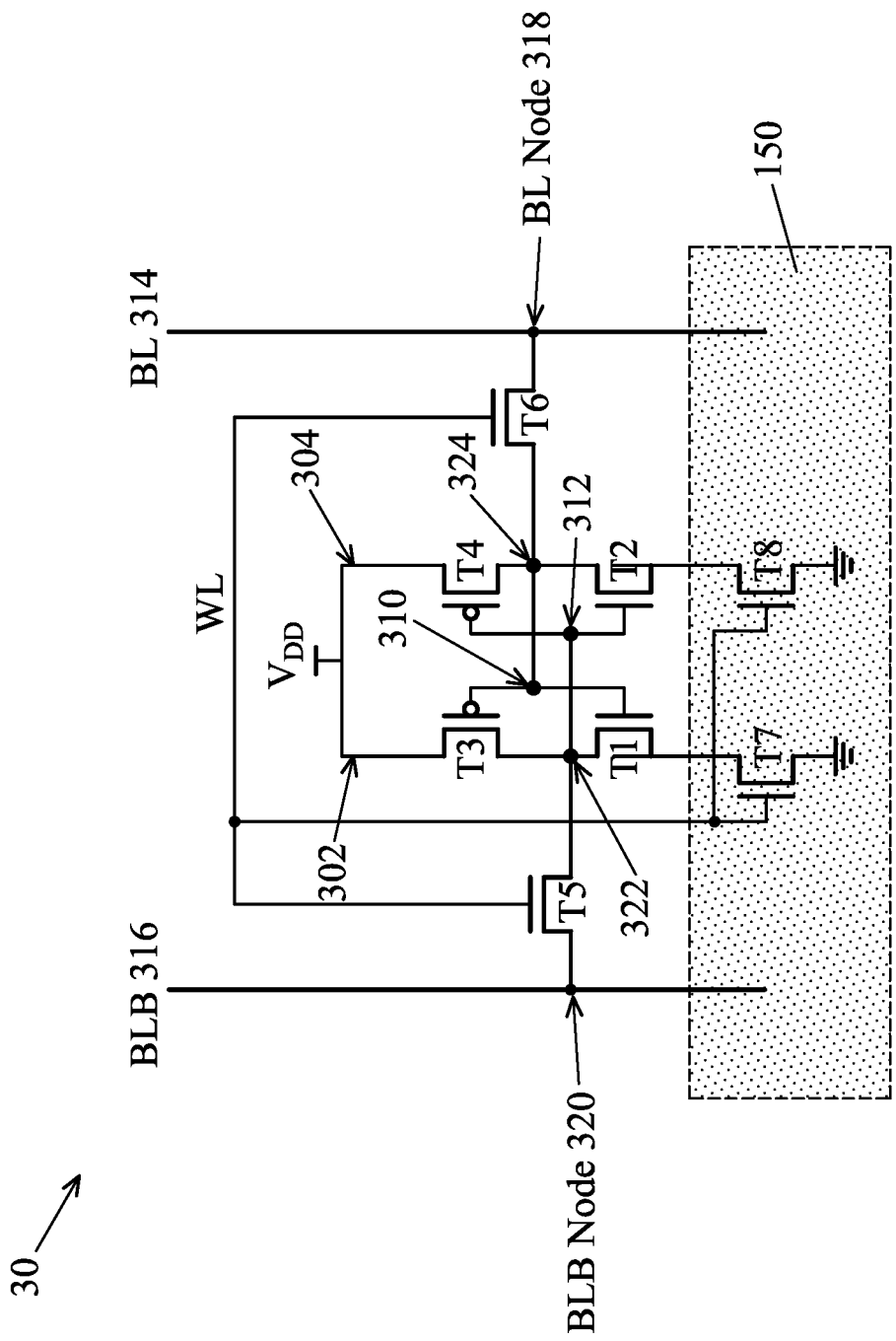
FIG. 4B illustrates a circuit diagram of an SRAM cell in accordance with some embodiments.

FIGS. 4A-4B illustrates a third memory array layout in accordance with some embodiments. As will be discussed in greater detail below, embodiments such as illustrated in FIGS. 4A-4B provide a memory array wherein a memory cell adjacent to the dummy region 150 are connected to power supply voltage Vss through a plurality of cut-off transistors. For example, as discussed in greater detail below, the pull-down transistor T1 is electrically coupled to power supply voltage Vss through a first cut-off transistor, and the pull-down transistor T2 is electrically coupled to power supply voltage Vss through a second cut-off transistor. Other memory cells in the memory array may be connected to the power supply voltage Vss without passing through either of the cut-off transistors. In this manner, the memory cell along the boundary with the dummy region 150 has a high resistance path to the power supply voltage Vss, thereby reducing leakage along the memory array boundary In some embodiments, SRAM array 1000 comprises a word line loading of 128 bits through word lines WL and a bit line loading of 64 bits through bit lines BL for a total storage capacity of 8 kilobits. Using 128 SRAM cells 20 down the word lines WL along the borders of each of the dummy regions 150, the standby leakage current of 128 times 2 bits (256 bits) of the 8 Kb of the SRAM array 1000 may be reduced by, for example, about 3%.

Referring now to FIG. 4A, an SRAM array comprising SRAM cells 10 and 30, respectively, is illustrated. SRAM cells 10 are positioned along an interior region of the memory array, and SRAM cells 30 are positioned along an interface between the memory array and the boundary region 150. Drivers 40 are connected to vertical BLs 314 and BLBs 316. Each SRAM cell 10 and each SRAM cell 30 in each column of the SRAM array is electrically connected to one BL 314 and one BLB 316. Each SRAM cell 10 and each SRAM cell 30 in each row of the SRAM array is connected to one horizontal word line WL.

FIG. 4B illustrates a circuit diagram of the SRAM cell 30 in accordance with some embodiments. The circuit diagram of SRAM cell 30 is similar to the layout of SRAM cell 20, wherein like reference numerals refer to like elements. Additionally, the source of PD transistor T1 is connected to the first source/drain region of a first cut-off transistor T7, and the source of PD transistor T2 is connected to a first source/drain region of a second cut-off transistor T8. The first cut-off transistor T7 and the second cut-off transistor T8 may be NMOS transistors. The second source/drain region of the first cut-off transistor T7 and the second source/drain region of the second cut-off transistor T8 are connected to the power supply voltage Vss. The gate of second cut-off transistor T8 is controlled by the word line WL of the memory cell adjacent to the boundary region 150. When the SRAM cell 20 is in standby mode and the WL is not asserted, the first cut-off transistors T7 and second cut-off transistor T8 will be switched off and function as high resistances. The leakage path of the transistors T1 or T2 to power supply voltage Vss through the first cut-off transistors T7 and the second cut-off transistor T8, respectively, may separate the voltage and reduce the standby leakage of the SRAM cell 20. The cut-off transistors T7 and T8 may be located in the dummy region 150 of the SRAM array containing SRAM cell 30, so the cut-off transistors T7 and T8 may not need additional process steps to create or area to occupy in comparison with a design not including the cut-off transistors T7 and T8.

Figure 5A:
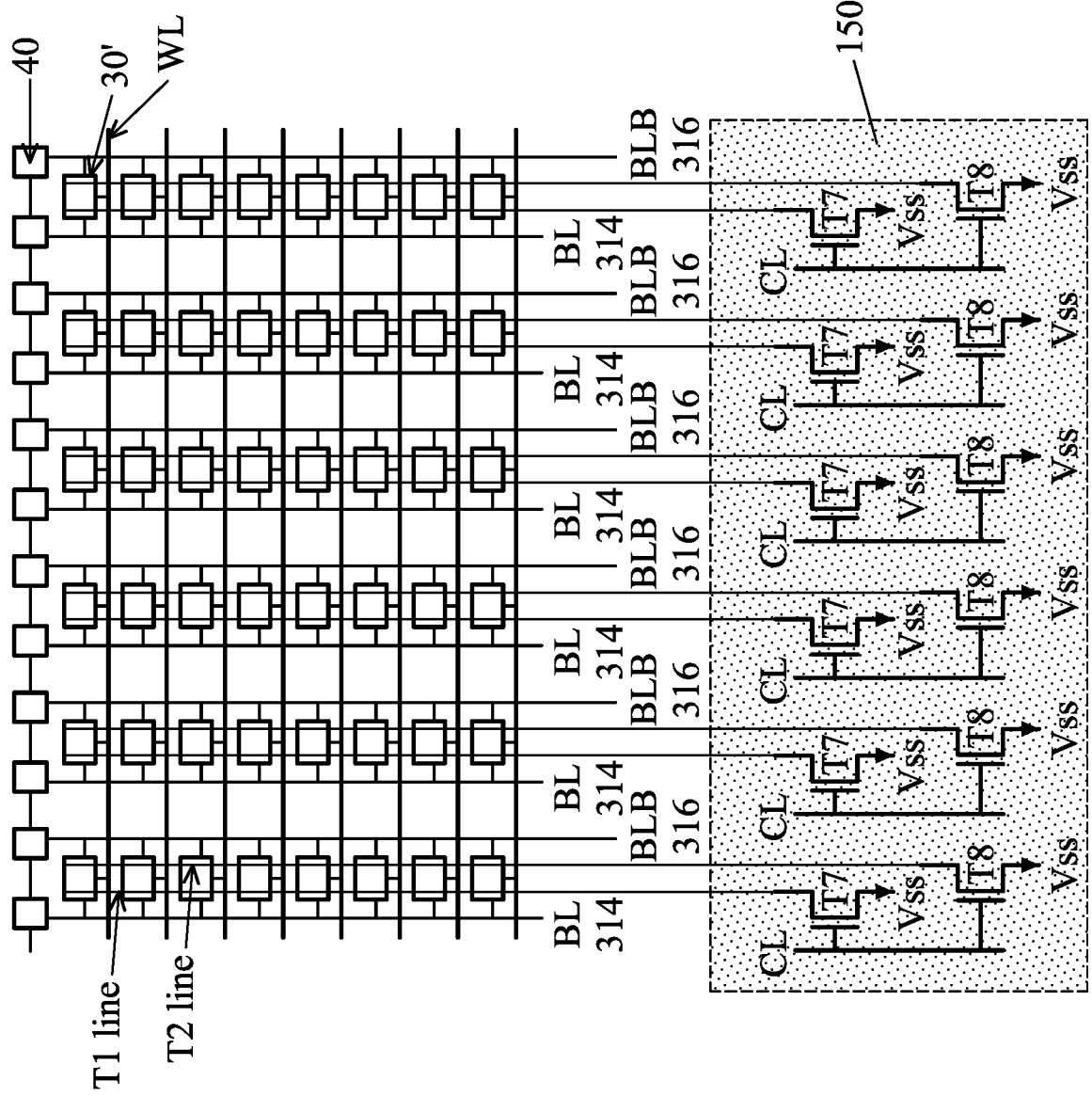
FIG. 5A illustrates a diagram of an SRAM array in accordance with some embodiments.
Figure 5B:
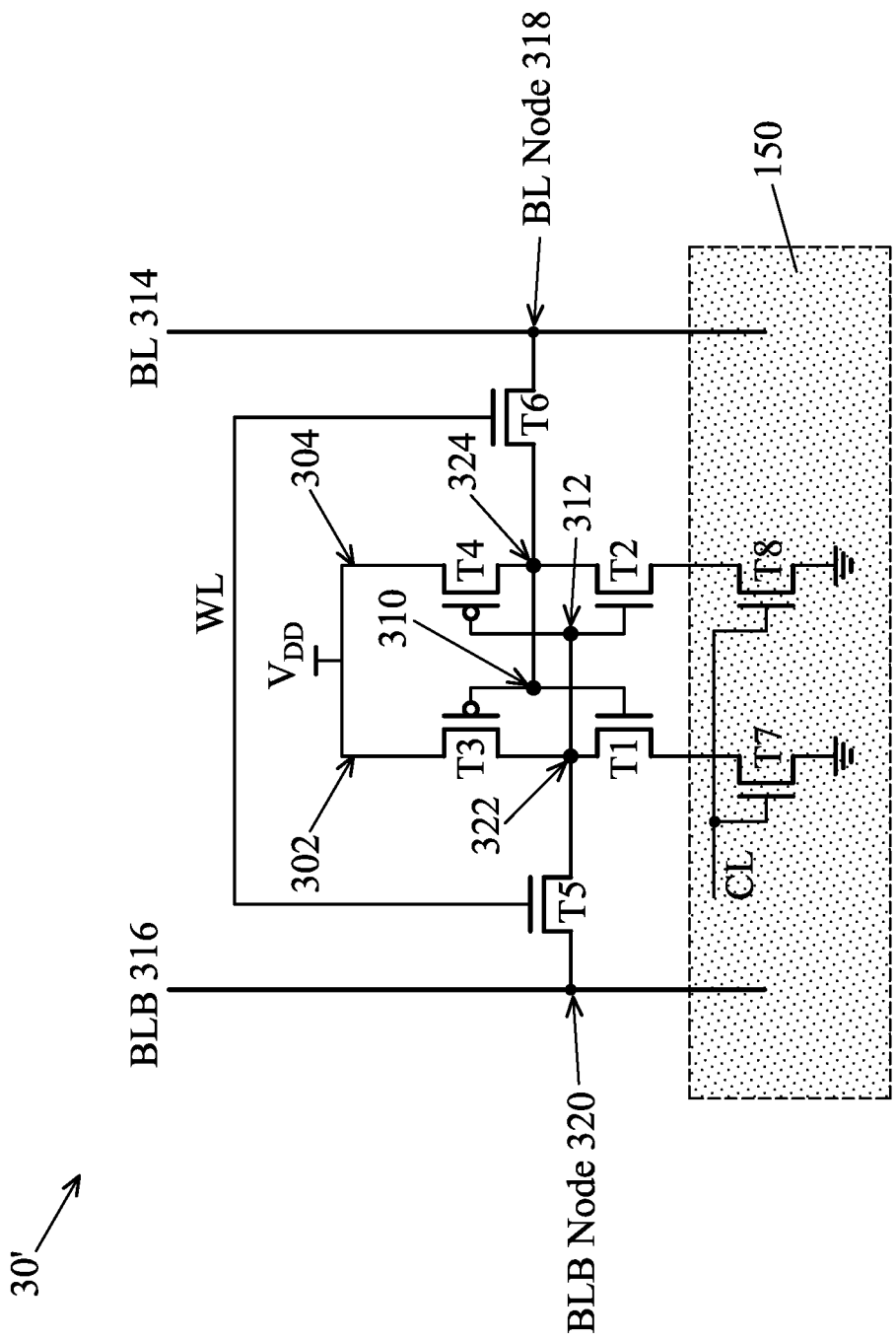
FIG. 5B illustrates a circuit diagram of an SRAM cell in accordance with some embodiments.

FIGS. 5A-5B illustrates a fourth memory array layout in accordance with some embodiments. As will be discussed in greater detail below, embodiments such as illustrated in FIGS. 5A-5B provide a memory array wherein the memory cells are connected to power supply voltage Vss through a plurality of cut-off transistors located in the dummy region 150. For example, a plurality of memory cells along a bit line may be connected to the power supply voltage through a first cut-off transistor and a second transistor, each may be located in the dummy region 150 and connected to the individual memory cells through the metallization layers as discussed below, thereby allowing a high resistance path to be created between each of the memory cells and the power supply voltage Vss, thereby reducing leakage of the individual memory cells in standby mode. Using SRAM cells 30' (see FIG. 5B) in place of SRAM cells 10 may reduce SRAM standby leakage. Standby current may be reduced by about 70% compared to a design consisting of only SRAM cells 10 with six transistors or the like, because using SRAM cells 30', causes the standby current to be reduced by reducing or limiting leakage through the cut-off transistors T7 and/or T8.

Referring now to FIG. 5A, an SRAM array comprising SRAM cells 30' (see FIG. 5B) is illustrated. The sources of the PD transistors T1 and T2 of each SRAM cell 30' are connected to the first source/drain region(s) of cut-off transistors T7 and T8, respectively, located outside the SRAM array in the dummy region 150. The second source/drain regions of the cut-off transistors T7 and T8 are connected to the power supply voltage Vss. The gates of the cut-off transistors T7 and T8 are controlled by respective control lines CL. In some embodiments, each pull-down transistor T1 of each SRAM cell 30' in each column of SRAM cells 30' coupled to a single bit line is connected to the first cut-off transistor T7, and each pull-down transistor T2 of each SRAM cell 30' in each column of SRAM cells 30' coupled to a single bit line is connected to the second cut-off transistor T8. Accordingly, there are two cut-off transistors T7 and T8 for each column. In some embodiments, a control line CL controlling the gates of the cut-off transistors T7 and T8 in one column is connected to the BL and BLB of the respective column, and the control line CL may be configured to turn on the cut-off transistors T7 and T8 when an SRAM cell 30' in the same column and connected to the same respective BL and BLB is selected for reading and/or writing.

FIG. 5B illustrates a circuit diagram of the SRAM cell 30' in accordance with some embodiments. The circuit diagram of SRAM cell 30' is similar to the layout of SRAM cell 30 (see FIG. 4A-4B), but with the cut-off transistors T7 and T8 connected to a separate control line CL instead of the word line WL. The cut-off transistors T7 and T8 may be located in the dummy region 150 of the SRAM array containing SRAM cell 30', so the cut-off transistors T7 and T8 may not need additional process steps to create or area to occupy in comparison with a design not including the cut-off transistors T7 and T8.

Figure 6:
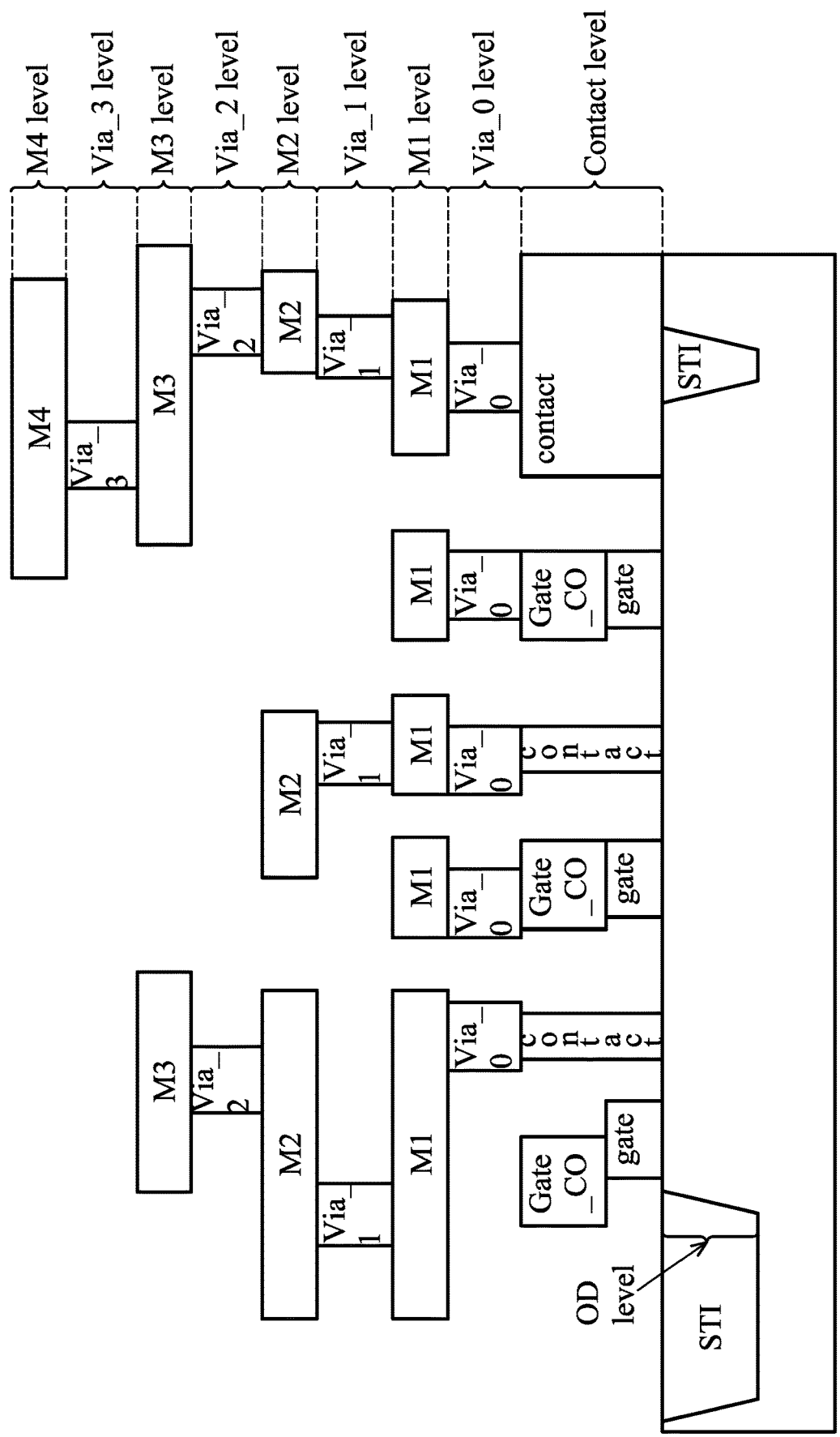
FIG. 6 illustrates a cross-sectional view of the layers involved in an SRAM cell array in accordance with some embodiments.

FIG. 6 illustrates a schematic cross-sectional view of a plurality of layers involved in SRAM cells 10, 20, 20' 30, and 30', which layers are formed on a semiconductor chip or wafer. It is noted that FIG. 6 is schematically illustrated to show various levels of interconnect structure and transistors to provide a reference for the layout description provided below, and may not reflect the actual cross-sectional view of SRAM cells 10, 20, 20' 30, or 30'. The interconnect structure includes a contact level, an OD (oxide definition or active area) level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contacts) for connecting gate electrodes of transistors (such as the illustrated exemplary transistors T3 and T4) to an overlying level such as the Via_0 level, and source/drain contacts (marked as "contact") for connecting the source/drain regions of transistors to the overlying level.

FIGS. 7A through 7F illustrate a detailed view of region 110 of FIG. 1, showing block diagrams of a layout of features of a memory cell (e.g., SRAM cell 20 as illustrated above in FIG. 2C), according to some embodiments. Region 110 comprises a portion of the memory region 100, a portion of the dummy region 150, and a portion of the PW/NW pickup region 200. Features are illustrated in different levels of SRAM cell 20 (e.g., OD level, contact level, via_0 level, M1 level, via-1 level, M2 level, see FIG. 6), which are consecutively described for clarity.

Figure 7A:
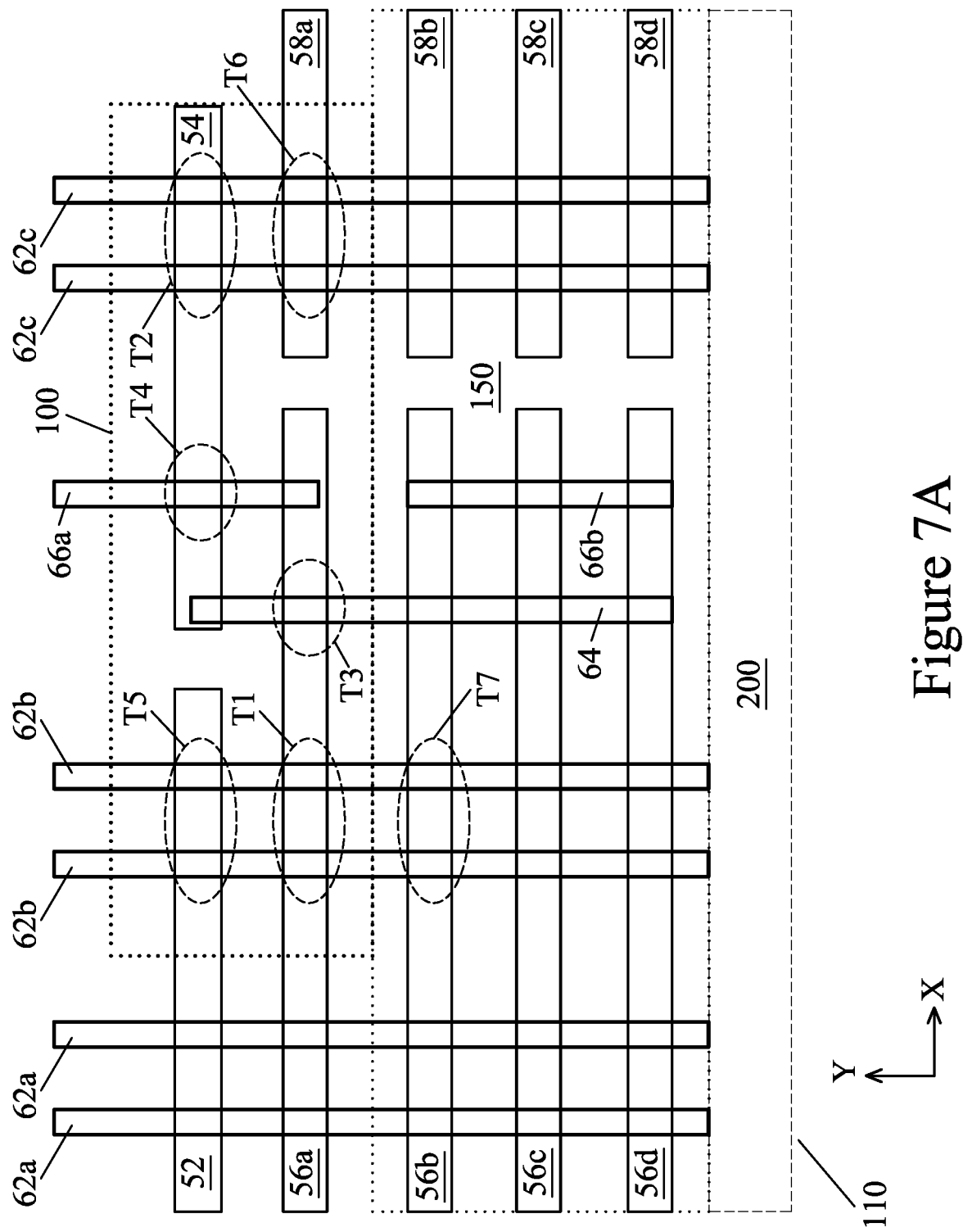
FIGS. 7A through 7F illustrate block diagrams of SRAM cell layouts in accordance with some embodiments.

Referring first to FIG. 7A, features in the OD level (FIG. 6) and overlying gate electrodes of various transistors in SRAM cell 20 are illustrated. Active regions 62a, 62b, and 62c extend from the memory region 100 into the dummy region 150. The active regions 62a, 62b, and 62c may be multiple fins, such as two fins. In some embodiments, the active regions 62a, 62b, and 62c extend across the dummy region 150 to the boundary with the PW/NW pickup region 200. The active region 64 also extends across the boundary of the memory region 100 with the dummy region 150. The active region 64 may be a single fin. The active region 66a may be a single fin in the memory region 100. The active region 66b may be a single fin in the dummy region 150 along a line running longitudinally through the active region 66a. The active regions 62a, 62b, 62c, 64, 66a, and 66b may be along a vertical direction Y.

Still referring to FIG. 7A, Gate electrodes 52, 54, 56a, 56b, 56c, 56d, 58a, 58b, 58c, and 58d may be along a horizontal direction X perpendicular to the vertical direction Y. Gate electrodes 52 and 54 may be in the memory region 100 along a horizontal line. Gate electrodes 56a and 58a may be in the memory region 100 along another horizontal line. In some embodiments, the first gap between the gate electrodes 52 and 54 is not aligned with the second gap between the gate electrodes 56a and 58a. Gate electrodes 56b-d and 58b-d may be in the dummy region 150 and separated from each other by gaps with widths substantially similar to W2. In some embodiments, some of the gate electrodes 56b-d and 58b-d that are not part of transistors may be dummy gates, e.g. inactive gates. The gaps between gate electrodes 56a-d and 58a-d, respectively, may be aligned along a vertical direction.

Further referring to FIG. 7A, in the memory region 100, gate electrode 56a forms a PD transistor T1 with an underlying active region 62b that may be two or more fins, such as fins 62b, disposed under the gate electrode 56a (e.g., gate electrode 56a may be disposed over and extend along sidewalls of the active region 62b). Gate electrode 56a further forms a PU transistor T3 with an underlying active region 64. In some embodiments, the active region T3 is a single fin 64 disposed under gate electrode 56a (e.g., gate electrode 56a may be disposed over and extend along sidewalls of the active region 64). Gate electrode 52 forms a PG transistor T5 with the active region 62b, which may be two or more fins such as fins 62b.

As further illustrated by FIG. 7A, gate electrode 54 forms a PU transistor T4 with an underlying active region 66a. In some embodiments, active region 66a is a single fin such as fin 66a disposed under gate electrode 54 (e.g., gate electrode 54 may be disposed over and extend along sidewalls of active region 66a). Gate electrode 54 further forms PD transistor T2 with an underlying active region 62c. In some embodiments, active region 62c comprises two or more fins, such as fins 62c, disposed under gate electrode 54 (e.g., gate electrode 54 may be disposed over and extend along sidewalls of the active region 62c). Gate electrode 58a forms PG transistor T6 with underlying active region 62c. In some embodiments, gate electrode 58a is disposed over and extends along sidewalls of active region 62c.

In the dummy region 150, gate electrode 56b forms the cut-off transistor T7 with the active region 62b, which may be two or more fins such as fins 62b. Because the cut-off transistor T7 is located in the dummy region 150 of the SRAM array 1000, the cut-off transistor T7 may not need additional process steps to create or area to occupy in comparison with a design not including the cut-off transistor T7.

In accordance with some embodiments of the present disclosure, PD transistors T1 and T2, PU transistors T3 and T4, PG transistors T5 and T6, and cut-off transistor T7 are Fin Field-Effect Transistors (FinFETs) as described above where active regions 64 and 66a are single fins and active regions 62b and 62c comprise multiple fins. Active regions 62b, 62c, 64, and 66a provide source/drains of various transistors on opposing sides of a respective gate electrode.

Figure 7B:
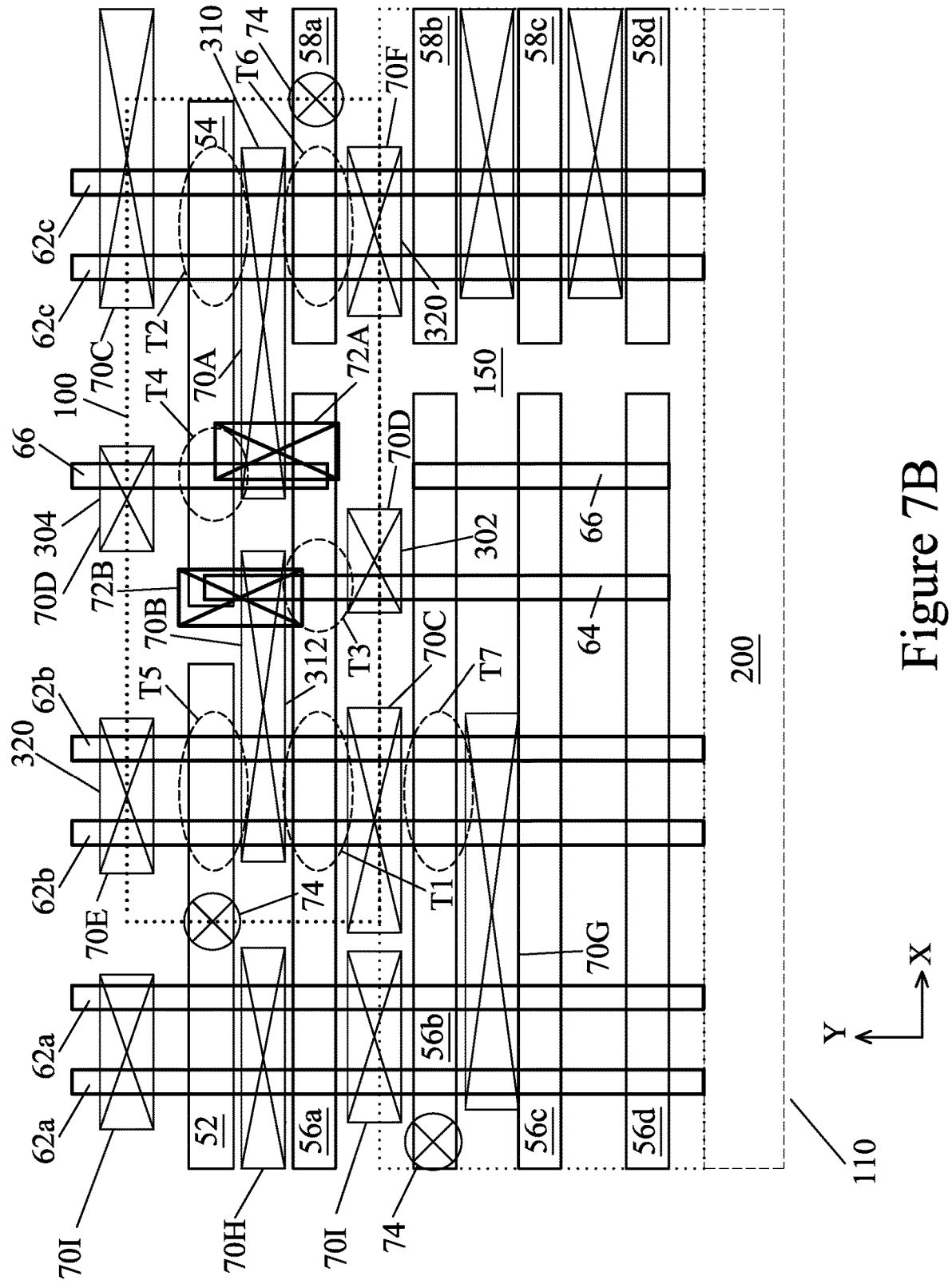

FIG. 7B illustrates features of SRAM cell 20 in the contact level (see FIG. 6) and lower. As shown in FIG. 7B, SD node 310 (see also FIG. 2) includes source/drain contact 70A and gate contact 72A, which are the features at the contact level of SRAM cell 20 (see FIG. 6). In some embodiments of the manufacturing of the SRAM cell 20 on physical semiconductor wafers, contacts 70A and 72A may be formed as a single continuous butted contact, such as an L-shaped butted contact. Source/drain contact 70A may be elongated and have a longitudinal direction in the X direction, which is parallel to the extending directions of gate electrodes 56a and 54. Gate contact 72A comprises a portion over, and is electrically connected to, gate electrode 56a. In accordance with some embodiments of the present disclosure, gate contact 72A has a longitudinal direction in the Y direction, with is perpendicular to the X direction.

SD node 312 includes source/drain contact 70B and gate contact 72B. Gate contact 72B has a portion overlapping source/drain contact 70B. Since SD node 310 may be symmetric to SD node 312, the details of gate contact 72B and source/drain contact 70B may be similar to gate contact 72A and source/drain contact 70A, respectively, and are not repeated herein for simplicity.

FIG. 7B also illustrates gate contacts 74 connected to gate electrodes 52, 56b, and 58a, which may be used to electrically couple gate electrodes 52, 56b, and 58a to one or more WLs as described in greater detail below.

Furthermore, elongated contacts 70C are used to connect to the source regions of PD transistors T1 and T2 to a CVss line (e.g., an electrical ground line) through cut-off transistor T7. Elongated contacts 70C have lengthwise directions parallel to the X direction, and may be formed to overlap the edges of SRAM cell 20. Furthermore, elongated contacts 70C may further extend into neighboring SRAM cells in a different column that abut SRAM cell 20. Elongated contacts 70C may further be shared between two neighboring SRAM cells in different rows that abut each other. Additionally, contacts 70D are used to connect to the source regions of PU transistors T3 and T4 to CVdd lines (e.g., supply voltage lines). Contacts 70D are parts of the CVdd nodes 302 and 304 (see also FIG. 2).

As further illustrated by FIG. 7B, contacts 70E and 70F are used to connect to the source/drain regions of PG transistors T5 and T6 to a BL and a BLB, respectively. Contacts 70E and 70F are parts of the BLB node 320 and BL node 316, respectively (see also FIG. 2). Contacts 70E and 70F may further be shared between two neighboring SRAM cells in different rows that abut each other. Elongated contact 70G is used to connect a source/drain region of cut-off transistor T7 to a CVss line (e.g., an electrical ground line). Additional contacts 70H and 70I may be formed over source/drain regions of active region 62a for transistors in another SRAM cell neighboring SRAM cell 20.

Figure 7C:
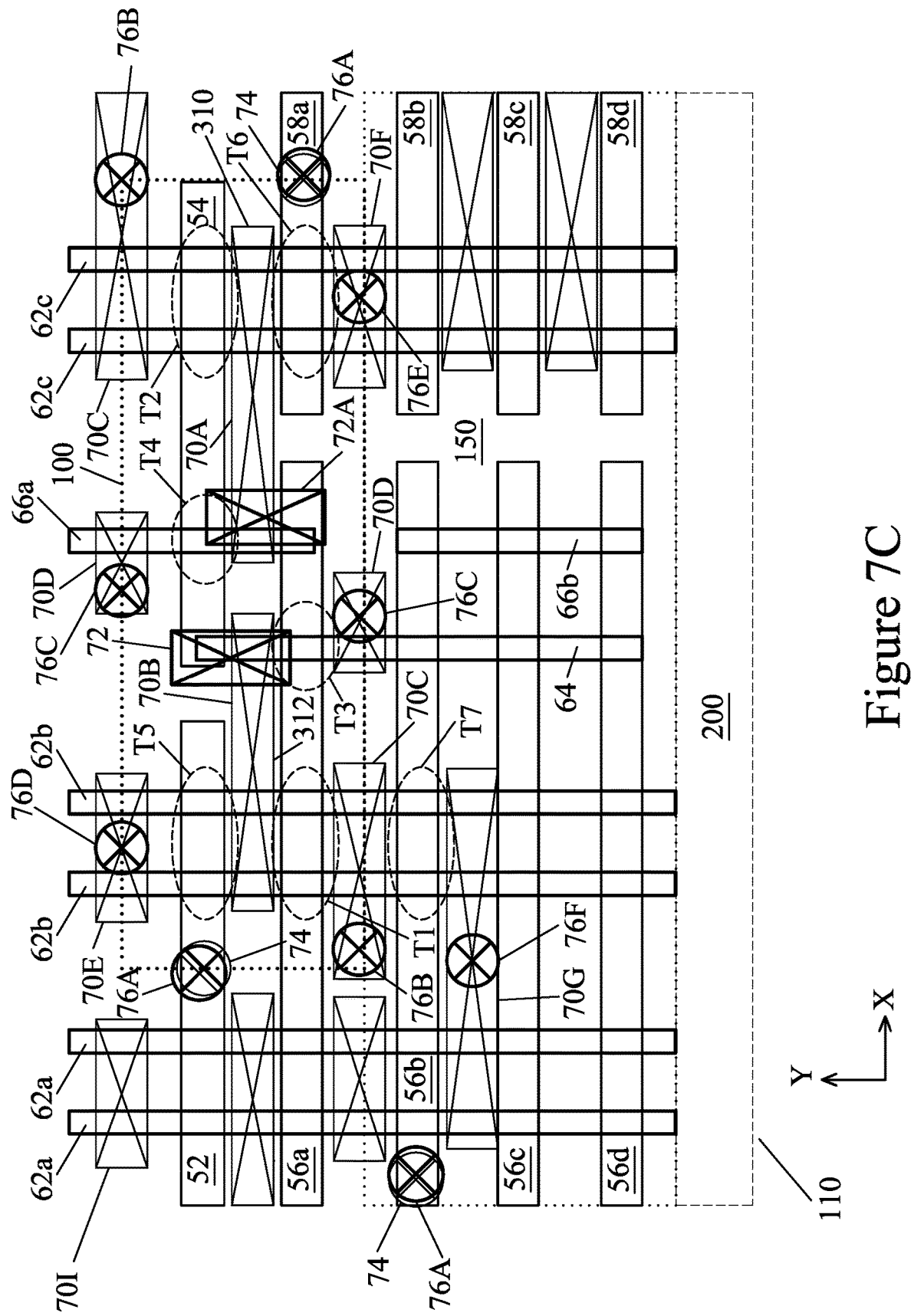

FIG. 7C illustrates features of SRAM cell 20 in the via_0 level (see FIG. 6) and lower. For example, vias 76 (labeled 76A through 76F) are disposed in the via_0 level (see FIG. 6).

As shown in FIG. 7C, vias 76A are connected to gate contacts 74 (e.g., gate contacts for transistors T5, T6, T7, or T8). Vias 76A are subsequently connected to conductive lines 80 (see FIG. 7D below), which may be used to electrically couple gate electrodes of transistors T5, T6 and T7 to one or more WLs as described in greater detail with respect to FIG. 7E below. Furthermore, vias 76B are connected to elongated contacts 70C (e.g., source contacts of PD transistors T1 and T2). Vias 76B are further connected to conductive lines 82 (see FIG. 7D), which may be used to electrically couple source regions of PD transistors T1 and T2 to each other and to a source/drain region of cut-off transistor T7, which is connected to a CVss line (e.g., an electrical ground line) as described in greater detail with respect to FIG. 7D below. Furthermore, vias 76B may further extend into neighboring SRAM cells in a different column that abut SRAM cell 20. Vias 76B may further be shared between two neighboring SRAM cells in different rows that abut each other.

Additionally, vias 76C are connected to contacts 70D (e.g., source contacts of PU transistors T3 and T4). Vias 76C will subsequently be connected to a CVdd line, which electrically connects sources of PU transistors T3 and T4 to CVdd, as illustrated below in FIG. 7D. Thus, vias 76C are parts of the CVdd nodes 302 and 304 (see also FIG. 2). Vias 76C may further be shared between two neighboring SRAM cells in different rows that abut each other.

As further illustrated by FIG. 7C, vias 76D and 76E are connected to contacts 70E and 70F (e.g., source/drain contacts of PG transistors T5 and T6), respectively. Vias 76D and 76E will be subsequently connected to a BLB 316 and a BL 314, respectively. Thus, vias 76D and 76E are parts of the BL node 320 and BLB node 318, respectively (see also FIG. 2). Vias 76D and 76E may be shared between two neighboring SRAM cells in different rows that abut each other.

Still referring to FIG. 7C, via 76F is connected to elongated contact 70G. Via 76F will be subsequently connected to the Vss or CVss line (e.g., an electrical ground line) as described in greater detail with respect to FIG. 7D below.

Figure 7D:
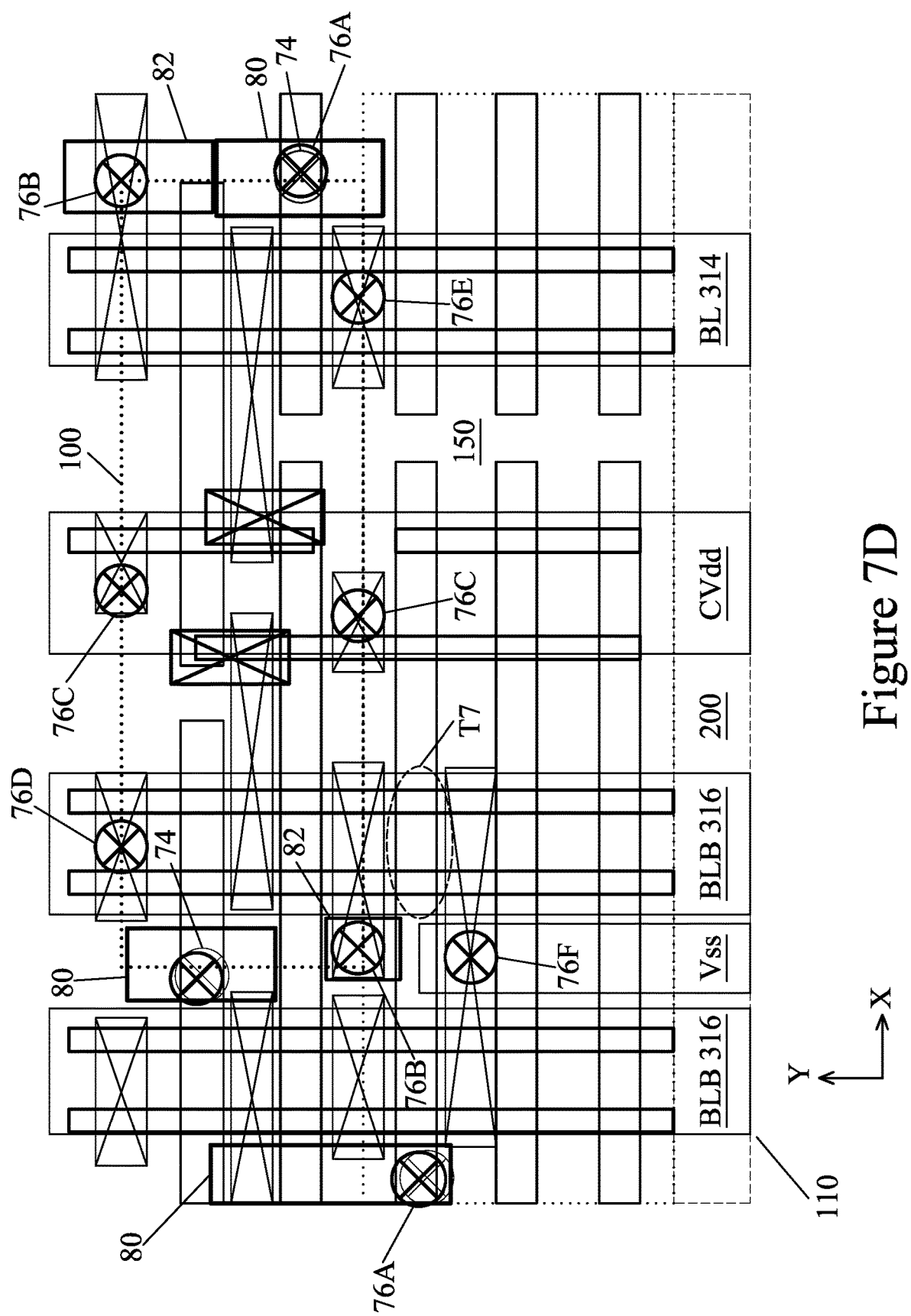

FIG. 7D illustrates features of SRAM cell 20 in the M1 level and lower (see FIG. 6). For example, various conductive lines such as conductive lines 80, conductive lines 82, BL 314, CVdd line, BLB lines 316, and the Vss or CVss line are disposed in the M1 level over various vias in the via_0 level.

As shown in FIG. 7D, conductive lines 80 are connected to vias 76A. Conductive lines 80 may be used to electrically couple gate electrodes of PG transistors T5 and T6 and of cut-off transistor T7 to one or more WLs as described in greater detail with respect to FIG. 7E below. Furthermore, conductive lines 82 are connected to vias 76B, and conductive lines 82 may be used to subsequently electrically couple source regions of PD transistors T1 and T2 to a CVss line (e.g., an electrical ground line) through cut-off transistor T7. Furthermore, conductive lines 82 may further extend into neighboring SRAM cells in a different column that abut SRAM cell 20. Conductive lines 82 may further be shared between two neighboring SRAM cells in different rows that abut each other. The Vss or CVss line (e.g., an electrical ground line) may be connected to the source/drain region of cut-off transistor T7 by the via 76F.

Figure 7E:
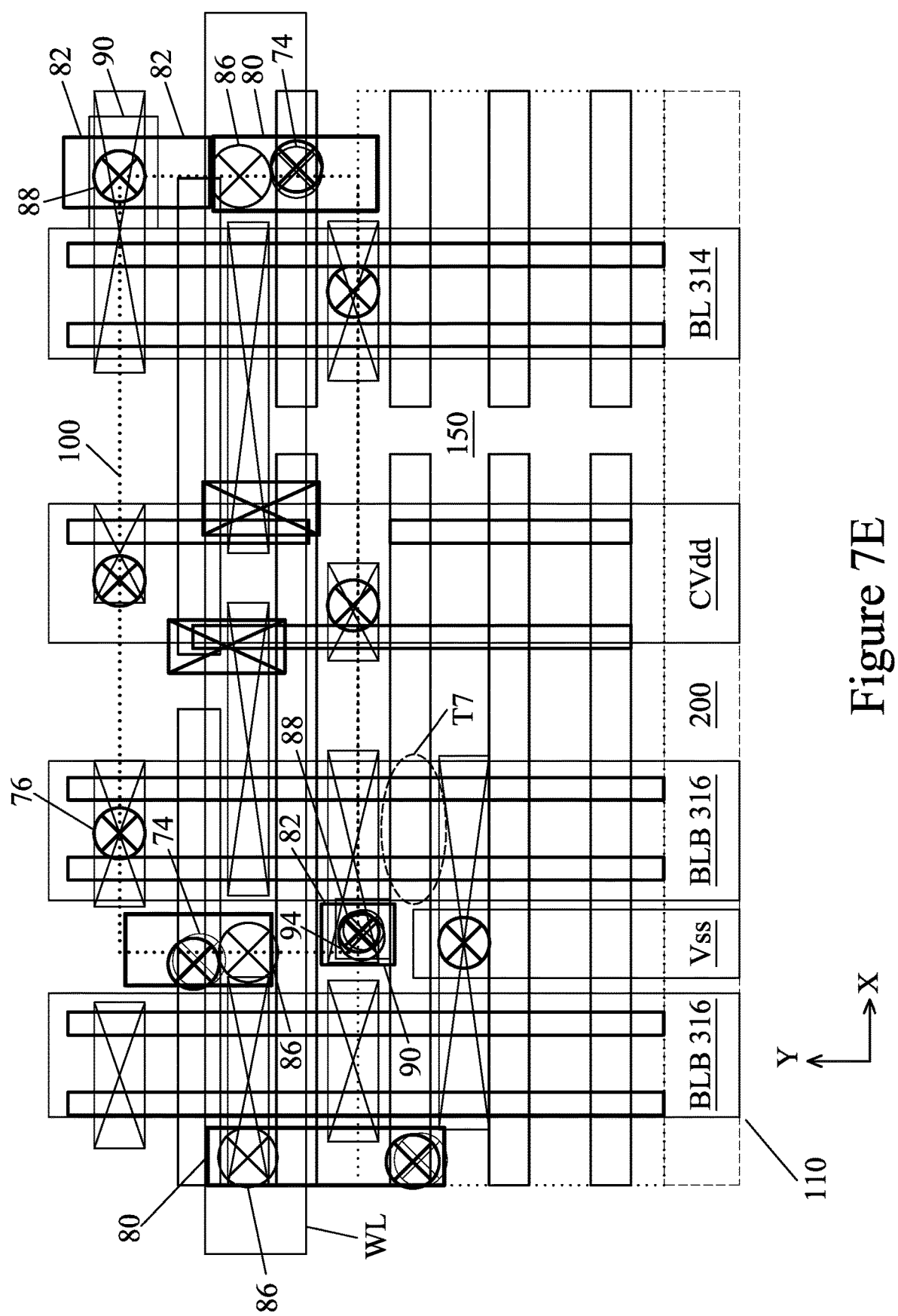

FIG. 7E illustrates features of SRAM cell 20 in the M2 and via_1 levels and lower (see FIG. 6). Vias 86 are disposed in the via_1 level and are connected to conductive lines 80, which electrically connect to vias 76A and gate contacts 74 (e.g., gate contacts for transistors T5, T6, or T7). Vias 86 further connect to the word line WL in the M2 level. Through the vias 76A and 86, the conductive lines 80, and the gate contacts 74, the word line WL is electrically coupled to the gate electrodes 52, 56a, and 56b of the transistors T5, T6, and T7, respectively. In some embodiments, the cut-off transistor T7 may be coupled to a control line CL rather than the word line WL coupled to the transistors T5 and T6. Thus, SRAM cell 20 includes WL nodes electrically connected to gates of the PG transistors T5 and T6 and the additional cut-off transistor T7.

As further shown in FIG. 7E, vias 88 are disposed in the via_1 level connected to conductive lines 82, which are connected to vias 76B, and vias 88 may be used to subsequently electrically couple source regions of PD transistors T1 and T2 to a CVss line (e.g., an electrical ground line) through transistor T7. Vias 88 further connect to conductive lines 90 in the M2 level.

Figure 7F:
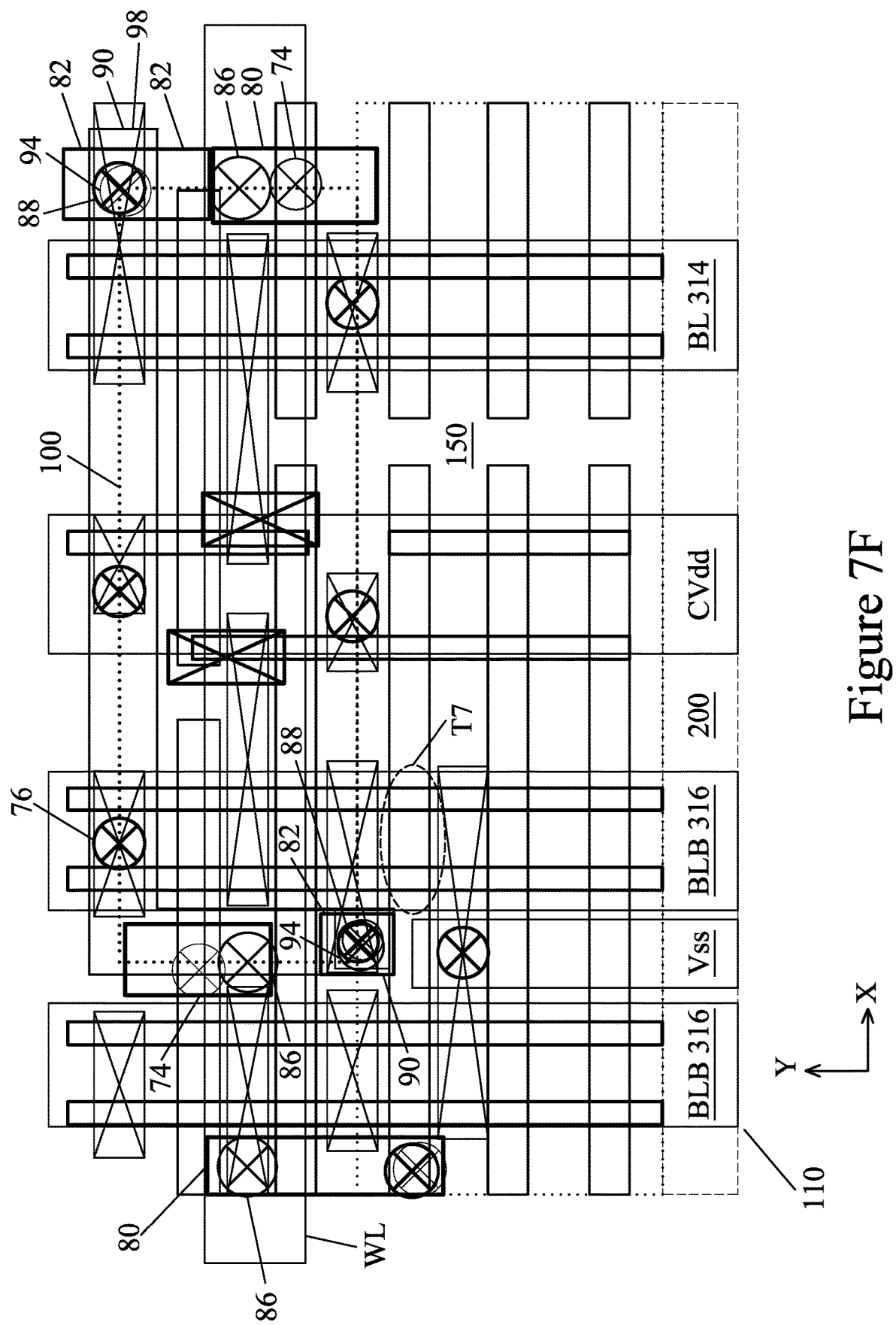

FIG. 7F illustrates features of SRAM cell 20 in the M3 and via_2 levels (see FIG. 6) and lower. In FIG. 7F, vias 94 are disposed in the via_2 level (see FIG. 6) while the conductive line 98 is disposed in the M3 level (see FIG. 6). As shown in FIG. 7F, conductive line 98 and vias 94 electrically connect the source regions of PD transistors T1 and T2 to a Vss or CVss line (e.g., an electrical ground line) through the cut-off transistor T7. Thus, conductive line 98 electrically connects the source regions of PD transistors T1 and T2 to a CVss line (e.g., an electrical ground line) through a source/drain region of transistor T7.

In some embodiments, vias 94 are connected to multiple conductive lines 98 that are connected to each other through higher vias and conductive lines in, for example, the via_3 and M4 levels (see FIG. 6). For example, in some embodiments, the conductive line 98 of each memory cell may be further connected to other source regions of PD transistors T1 and T2 in neighboring SRAM cells 20 and may couple the source regions of PD transistors T1 and T2 in the neighboring SRAM cells 20 to Vss through the cut-off transistor T7. The leakage path of the source regions of transistors T1 or T2 to Vss through the transistor T7 may reduce the standby leakage of the SRAM cell 20 when the transistor T7 is in standby mode and functioning as a resistance.

FIGS. 7A through 7F illustrate circuit diagrams in accordance with embodiments illustrated in FIGS. 2A through 2C that comprise SRAM cells 20 illustrated in FIG. 2C above. In some embodiments in accordance with FIGS. 3A and 3B, SRAM cells 20' (see FIG. 3B) have similar layouts as SRAM cells 20 as illustrated in FIGS. 7A through 7F but with cut-off transistors T7 and T8 connected to one or more separate control lines CL instead of to the word line WL.

FIGS. 8A through 8F illustrate a detailed view of region 110 of FIG. 1, showing block diagrams of a layout of features of a memory cell (e.g., SRAM cell 30 as illustrated above in FIG. 4B), according to some embodiments. Region 110 comprises a portion of the memory region 100, a portion of the dummy region 150, and a portion of the PW/NW pickup region 200. Features are illustrated in different levels of SRAM cell 30 (e.g., OD level, contact level, via_0 level, M1 level, via-1 level, M2 level, see FIG. 6), which are consecutively described for clarity.

Figure 8A:
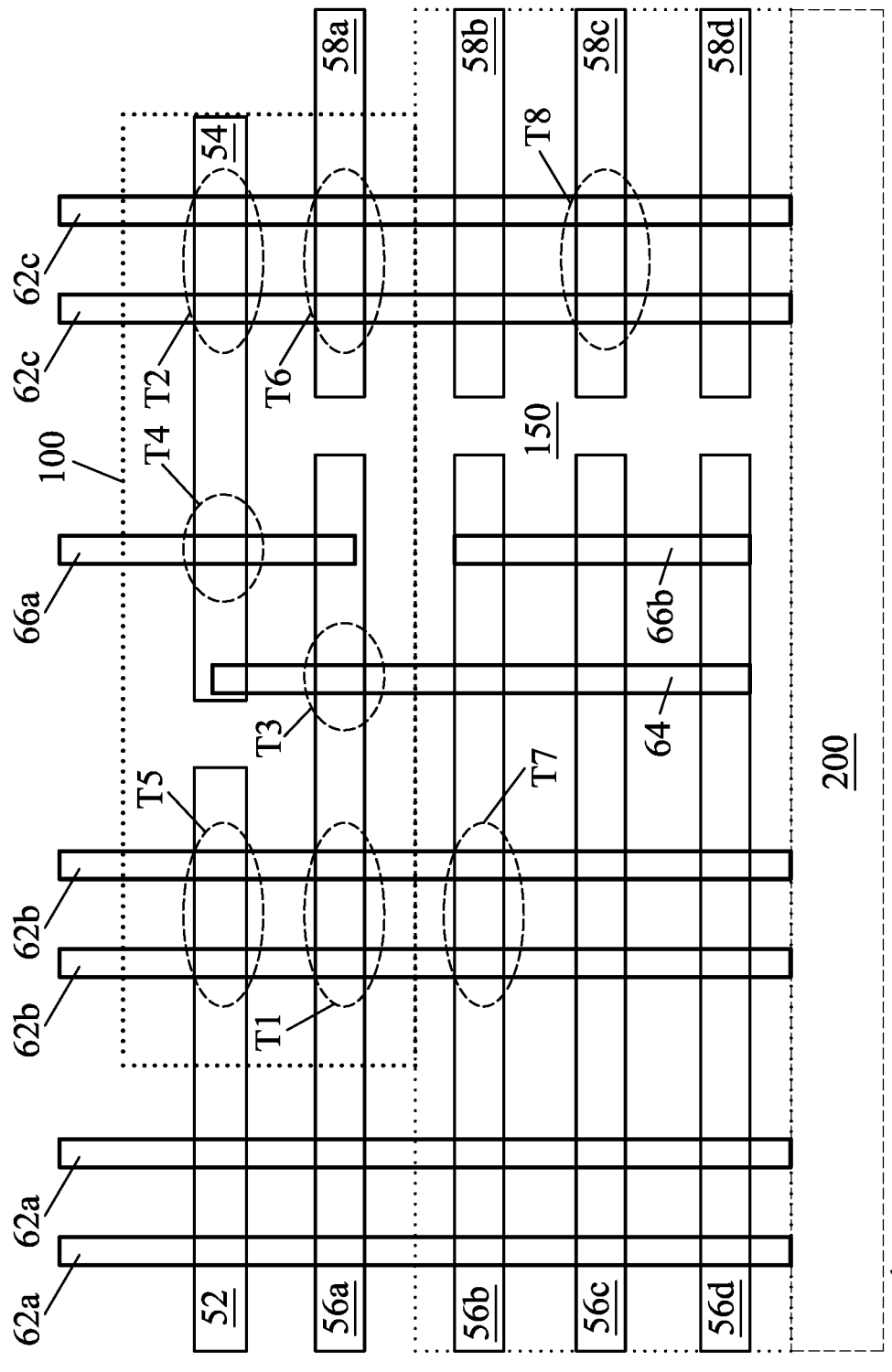
FIGS. 8A through 8F illustrate block diagrams of SRAM cell layouts in accordance with some embodiments.

Referring first to FIG. 8A, features in the OD level (FIG. 6) and overlying gate electrodes of various transistors in SRAM cell 30 are illustrated. The active regions and gate electrodes may have a substantially similar layout to SRAM cell 20 as illustrated above with respect to FIG. 7A.

In the dummy region 150, gate electrode 56b forms the additional cut-off transistor T7 with the active region 62b, which may be two or more fins such as fins 62b, and gate electrode 58c forms the additional cut-off transistor T8 with the active region 62c, which may be two or more fins such as fins 62c. Because the additional cut-off transistors T7 and T8 are located in the dummy region 150 of the SRAM array 1000, the additional cut-off transistors T7 and T8 may not need additional process steps to create or area to occupy in comparison with a design not including the additional cut-off transistors T7 and T8.

In accordance with some embodiments of the present disclosure, PD transistors T1 and T2, PU transistors T3 and T4, PG transistors T5 and T6, and additional transistors T7 and T8 are Fin Field-Effect Transistors (FinFETs) as described above where active regions 64 and 66a are single fins and active regions 62b and 62c comprise multiple fins. Active regions 62b, 62c, 64, and 66a provide source/drains of various transistors on opposing sides of a respective gate electrode.

Figure 8B:
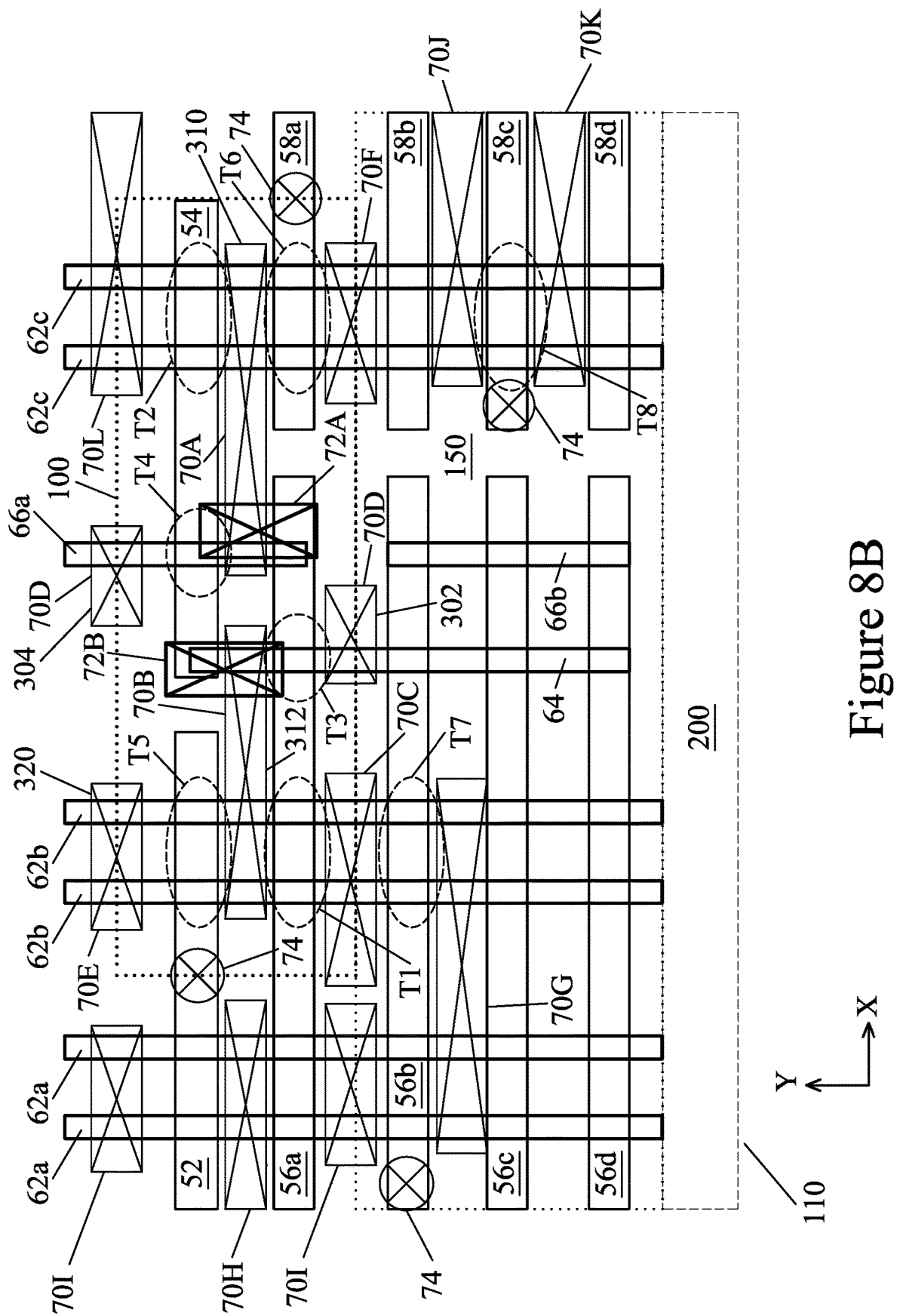

FIG. 8B illustrates features of SRAM cell 30 in the contact level (see FIG. 6) and lower. As shown in FIG. 8B, SD node 310 (see also FIG. 3) includes source/drain contact 70A and gate contact 72A, which are the features at the contact level of SRAM cell 30 (see FIG. 6). In some embodiments of the manufacturing of the SRAM cell 30 on physical semiconductor wafers, contacts 70A and 72A may be formed as a single continuous butted contact, such as an L-shaped butted contact. Source/drain contact 70A may be elongated and have a longitudinal direction in the X direction, which is parallel to the extending directions of gate electrodes 56a and 54. Gate contact 72A comprises a portion over, and is electrically connected to, gate electrode 56a. In accordance with some embodiments of the present disclosure, gate contact 72A has a longitudinal direction in the Y direction, which is perpendicular to the X direction.

SD node 312 includes source/drain contact 70B and gate contact 72B. Gate contact 72B has a portion overlapping source/drain contact 70B. Since SD node 310 may be symmetric to SD node 312, the details of gate contact 72B and source/drain contact 70B may be similar to gate contact 72A and source/drain contact 70A, respectively, and are not repeated herein for simplicity.

FIG. 8B also illustrates gate contacts 74 connected to gate electrodes 52, 56b, 58a, and 58c, which may be used to electrically couple gate electrodes 52, 56b, 58a, and 58c to one or more WLs as described in greater detail below.

Furthermore, the elongated contact 70C is used to connect the source region of PD transistor T1 to a CVss line (e.g., an electrical ground line) through transistor T7. The leakage path of the source region of the transistor T1 to Vss through the transistor T1 may reduce the standby leakage of the SRAM cell 30 when the transistor T1 is in standby mode and functioning as a resistance. The elongated contact 70C has a lengthwise direction parallel to the X direction, and may be formed to overlap the edges of SRAM cell 30. Furthermore, the elongated contact 70C may further extend into a neighboring SRAM cell in a different column that abuts SRAM cell 30. The elongated contact 70C may further be shared between two neighboring SRAM cells in different rows that abut each other. Additionally, contacts 70D are used to connect to the source regions of PU transistors T3 and T4 to CVdd lines (e.g., supply voltage lines). Contacts 70D are parts of the CVdd nodes 302 and 304 (see also FIG. 3).

As further illustrated by FIG. 8B, contacts 70E and 70F are used to connect to the source/drain regions of PG transistors T5 and T6 to a BL and a BLB, respectively. Contacts 70E and 70F are parts of the BLB node 320 and BL node 316, respectively (see also FIG. 3). Contacts 70E and 70F may further be shared between two neighboring SRAM cells in different rows that abut each other. Elongated contact 70G is used to connect a source/drain region of additional transistor T7 to a CVss line (e.g., an electrical ground line). Additional contacts 70H and 70I may be formed over source/drain regions of active region 62a for transistors in another SRAM cell adjacent to SRAM cell 30.

Still referring to FIG. 8B, elongated contacts 70J and 70L are used to connect the source region of PD transistor T2 to a source/drain region of cut-off transistor T8, which is connected to a CVss line (e.g., an electrical ground line). Elongated contact 70K is used to connect a source/drain region of the cut-off transistor T8 to a CVss line (e.g., an electrical ground line).

Figure 8C:
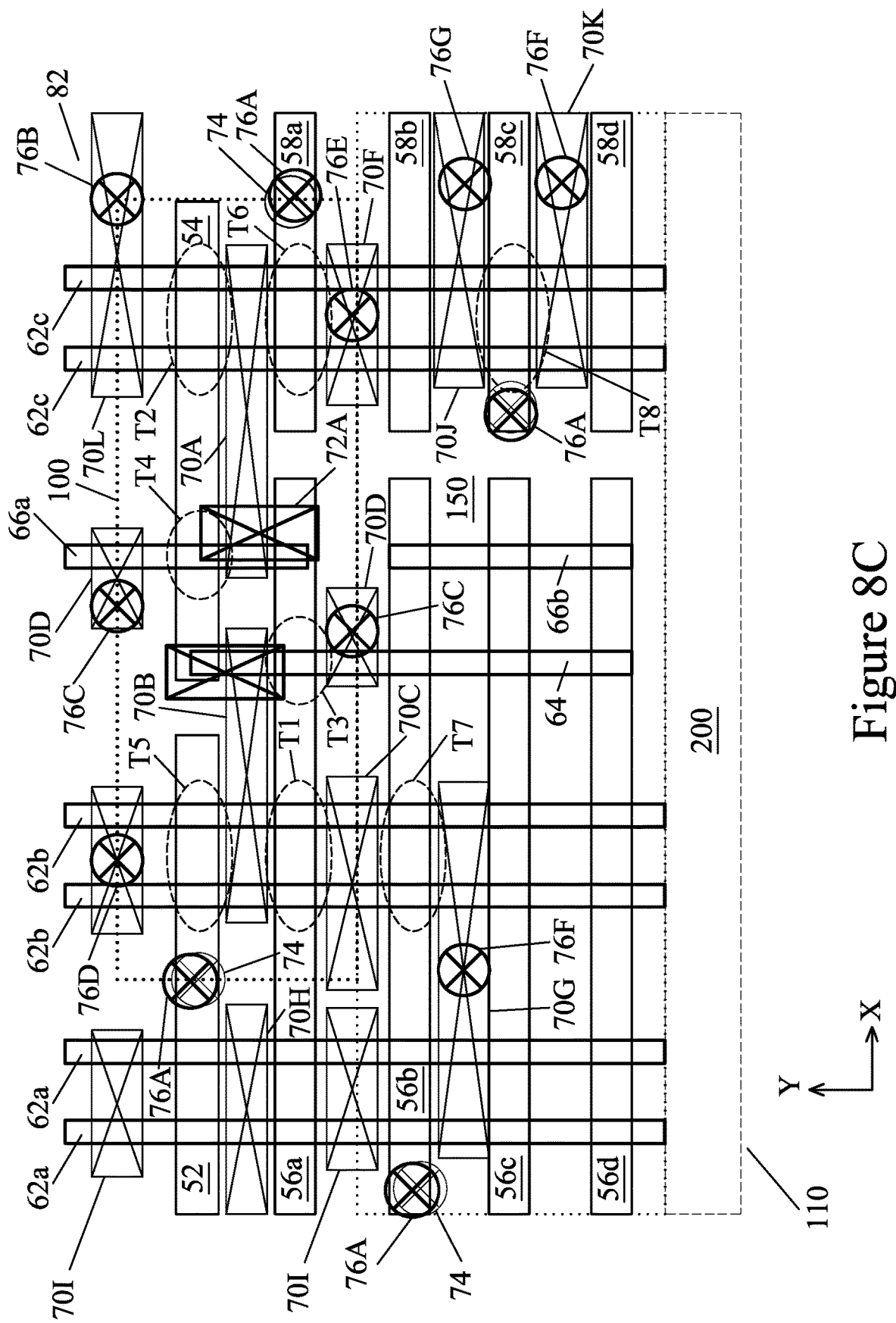

FIG. 8C illustrates features of SRAM cell 30 in the via_0 level (see FIG. 6) and lower. For example, vias 76 (labeled 76A through 76G) are disposed in the via_0 level (see FIG. 6).

As shown in FIG. 8C, vias 76A are connected to gate contacts 74 (e.g., gate contacts for transistors T5, T6, T7, or T8). Vias 76A are subsequently connected to conductive lines 80 (see FIG. 8D below), which may be used to electrically couple gate electrodes of transistors T5, T6, T7, and T8 to one or more WLs as described in greater detail with respect to FIG. 8E below. Furthermore, vias 76B and 76G are connected to the elongated contacts 70L and 70J (e.g., the source or source/drain contacts of the transistors T2 and T8, respectively). Vias 76B and 76G are further connected to conductive lines 82 (see FIG. 8D), which may be used to electrically couple the source region of PD transistor T2 to a source/drain region of cut-off transistor T8, which is connected to a CVss line (e.g., an electrical ground line) as described in greater detail with respect to FIG. 8D below. Furthermore, vias 76B may further extend into neighboring SRAM cells in a different column that abut SRAM cell 30. Vias 76B may further be shared between two neighboring SRAM cells in different rows that abut each other.

Additionally, vias 76C are connected to contacts 70D (e.g., source contacts of PU transistors T3 and T4). Vias 76C will subsequently be connected to a CVdd line, which electrically connects sources of PU transistors T3 and T4 to CVdd, as illustrated below in FIG. 8D. Thus, vias 76C are parts of the CVdd nodes 302 and 304 (see also FIG. 3). Vias 76C may further be shared between two neighboring SRAM cells in different rows that abut each other.

As further illustrated by FIG. 8C, vias 76D and 76E are connected to contacts 70E and 70F (e.g., source/drain contacts of PG transistors T5 and T6), respectively. Vias 76D and 76E will be subsequently connected to a BLB 316 and a BL 314, respectively. Thus, vias 76D and 76E are parts of the BL node 320 and BLB node 318, respectively (see also FIG. 2). Vias 76D and 76E may be shared between two neighboring SRAM cells in different rows that abut each other.

Still referring to FIG. 8C, vias 76F will be subsequently connected to elongated contacts 70G and 70K. Vias 76F are further connected to the Vss or CVss lines (e.g., electrical ground lines) as described in greater detail with respect to FIG. 8D below.

Figure 8D:
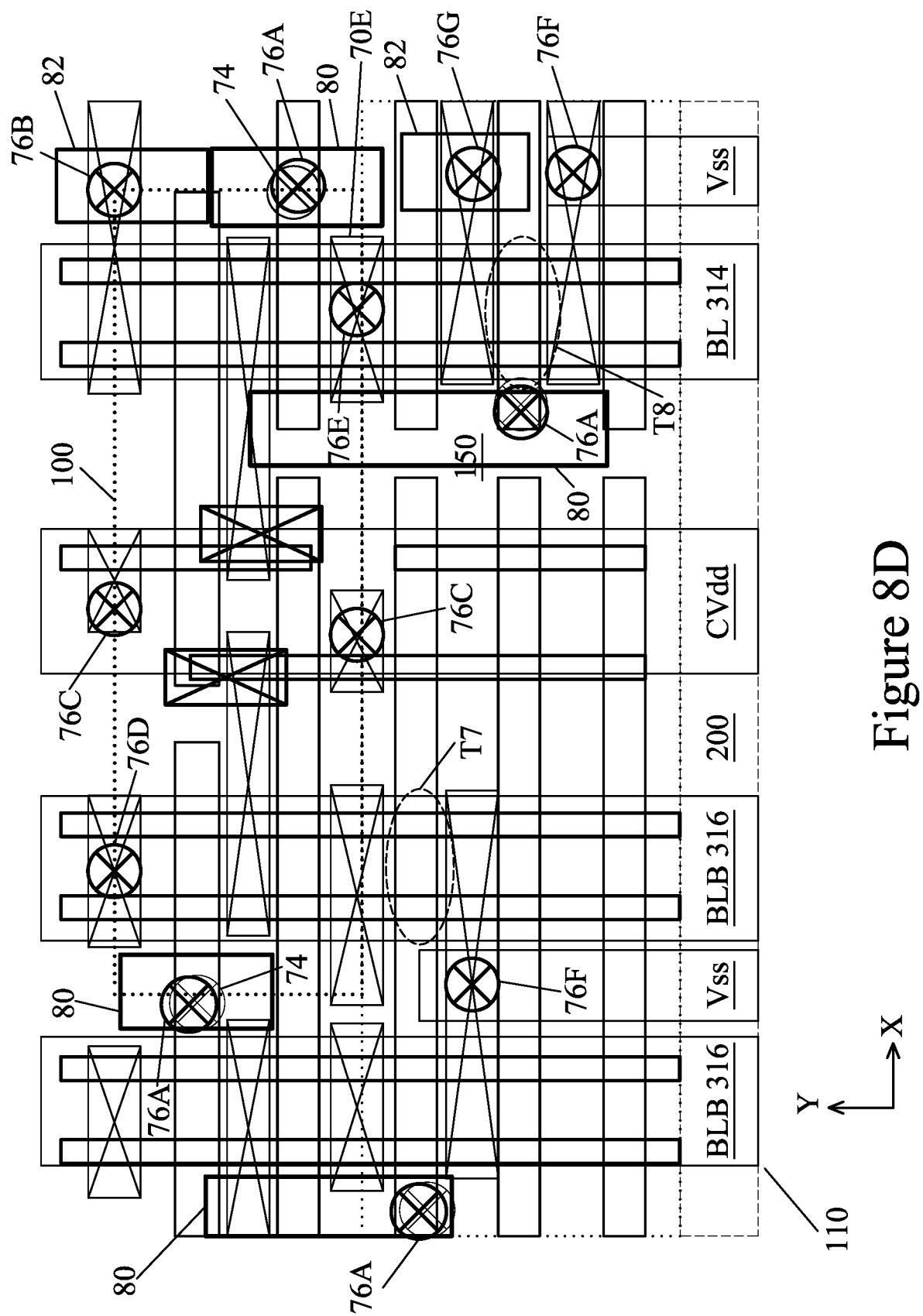

FIG. 8D illustrates features of SRAM cell 30 in the M1 level and lower (see FIG. 6). For example, various conductive lines such as conductive lines 80, conductive lines 82, BL 314, CVdd line, BLB lines 316, and the Vss or CVss lines are disposed in the M1 level over various vias in the via_0 level.

As shown in FIG. 8D, conductive lines 80 are connected to vias 76A. Conductive lines 80 may be used to electrically couple gate electrodes of PG transistors T5 and T6 and additional cut-off transistors T7 and T8 to one or more WLs as described in greater detail with respect to FIG. 8F below. Furthermore, conductive lines 82 are connected to vias 76B, and conductive lines 82 may be used to subsequently electrically couple the source region of PD transistor T2 to a CVss line (e.g., an electrical ground line) through transistor T8. Furthermore, conductive lines 82 may further extend into neighboring SRAM cells in a different column that abut SRAM cell 30. Conductive lines 82 may further be shared between two neighboring SRAM cells in different rows that abut each other. The Vss or CVss lines (e.g., an electrical ground line) may be connected to the source/drain regions of cut-off transistors T7 and T8 by the vias 76F.

Figure 8E:
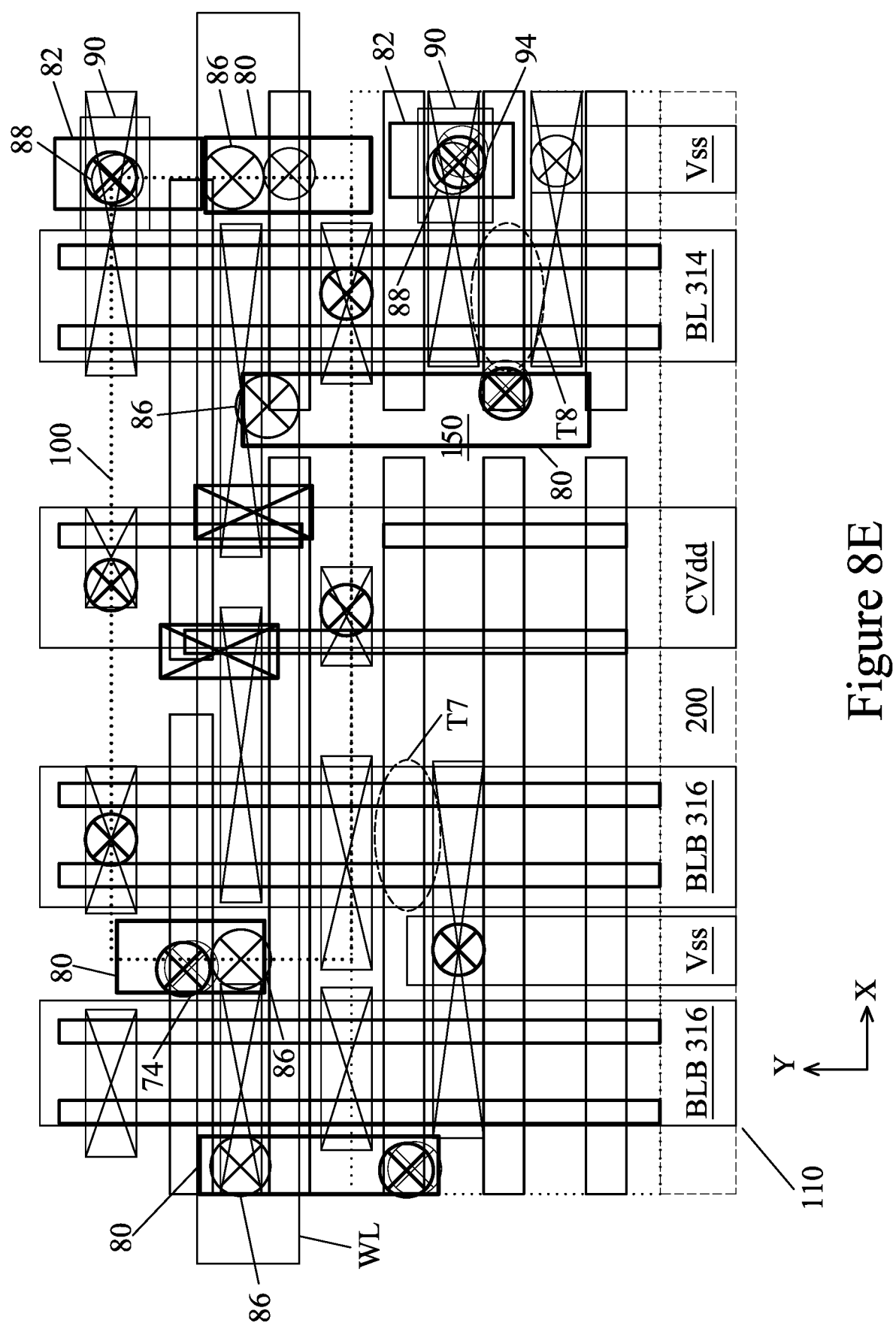

FIG. 8E illustrates features of SRAM cell 30 in the M2 and via_1 levels and lower (see FIG. 6). Vias 86 are disposed in the via_1 level and are connected to conductive lines 80, which electrically connect to vias 76A and gate contacts 74 (e.g., gate contacts for transistors T5, T6, T7, or T8). Vias 86 further connect to the word line WL in the M2 level. Through the vias 76A and 86, the conductive lines 80, and the gate contacts 74, the word line WL is electrically coupled to the gate electrodes 52, 56a, 56b, and 58c of the transistors T5, T6, T7, and T8, respectively. In some embodiments, the cut-off transistors T7 and T8 may be coupled to a control line CL rather than the word line WL coupled to the transistors T5 and T6. Thus, SRAM cell 30 includes WL nodes electrically connected to gates of the PG transistors T5 and T6 and the additional cut-off transistors T7 and T8.

As further shown in FIG. 8E, vias 88 are disposed in the via_1 level connected to conductive lines 82, which are connected to vias 76B, and vias 88 may be used to subsequently electrically couple the source region of PD transistor T2 to a CVss line (e.g., an electrical ground line) through cut-off transistor T8. Vias 88 further connect to conductive lines 90 in the M2 level.

Figure 8F:
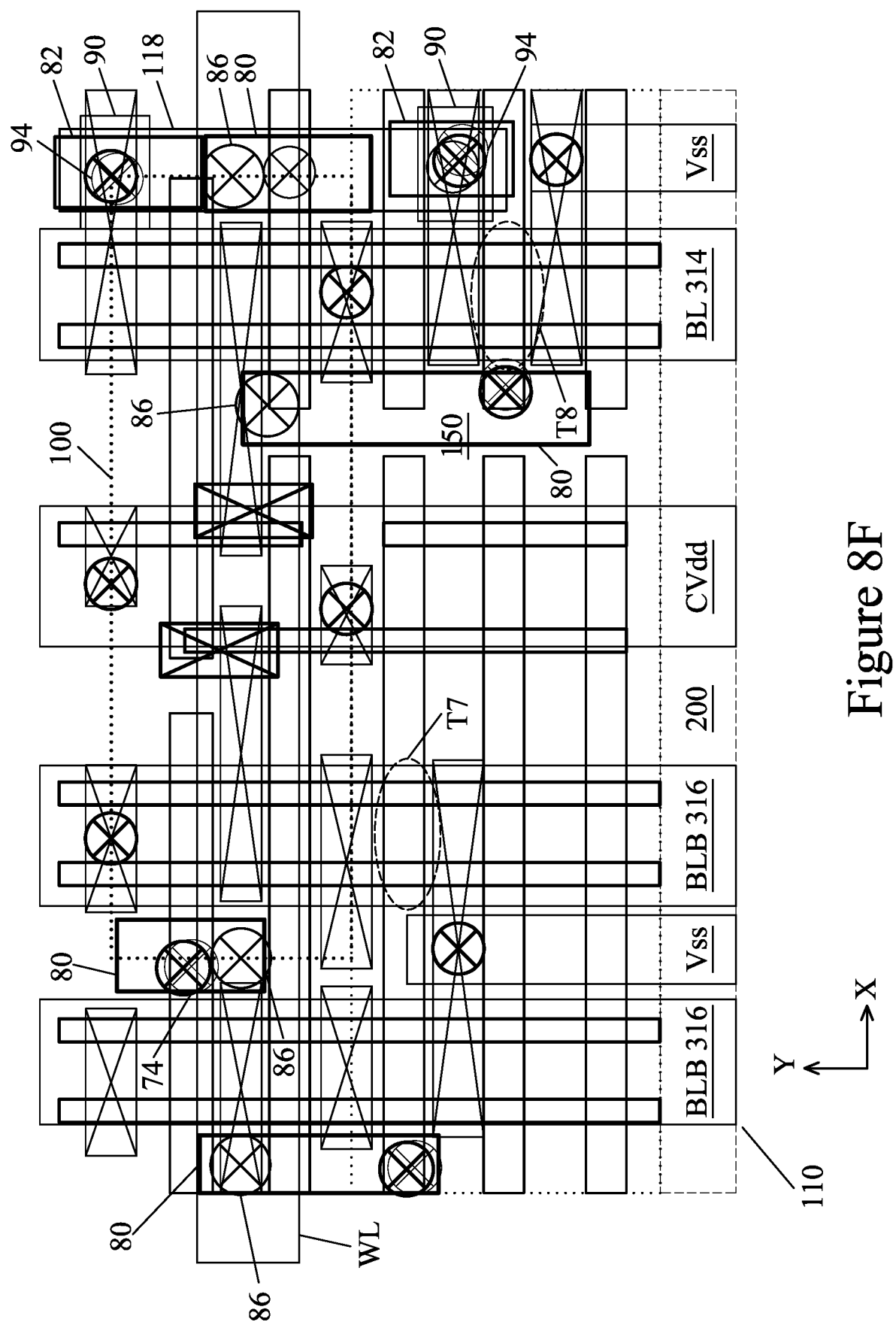

FIG. 8F illustrates features of SRAM cell 30 in the M3 and via_2 levels (see FIG. 6) and lower. In FIG. 8F, vias 94 are disposed in the via_2 level (see FIG. 6) while the conductive line 98 is disposed in the M3 level (see FIG. 6). As shown in FIG. 8F, conductive line 98 is connected to vias 94, which further electrically connects the source region of PD transistor T2 to a Vss or CVss line (e.g., an electrical ground line) through the cut-off transistor T8. Thus, conductive line 98 electrically connects the source region of PD transistor T2 to a CVss line (e.g., an electrical ground line) through a source/drain region of cut-off transistor T8.

In some embodiments, vias 94 are connected to multiple conductive lines 98 that are connected to each other through higher vias and conductive lines in the via_3 and M4 levels (see FIG. 6). The leakage path of the source region of the transistor T2 to Vss through the cut-off transistor T8 may reduce the standby leakage of the SRAM cell 30 when the transistor T8 is in standby mode and functioning as a resistance. In some embodiments, the conductive line 98 is further connected to other source regions of PD transistors T2 in neighboring SRAM cells 30 and couples the source regions of PD transistors T2 in the neighboring SRAM cells 30 to Vss through the cut-off transistor T8. Other conductive lines and vias (not illustrated) may couple the source regions of PD transistors T1 in the neighboring SRAM cells 30 to Vss through the cut-off transistor T7.

FIGS. 8A through 8F illustrate circuit diagrams in accordance with embodiments illustrated in FIGS. 4A and 4B that comprise SRAM cells 30 illustrated in FIG. 4B above. In some embodiments in accordance with FIGS. 5A and 5B, SRAM cells 30' (see FIG. 5B) have similar layouts as SRAM cells 30 as illustrated in FIGS. 8A through 8F but with cut-off transistors T7 and T8 connected to one or more separate control lines CL instead of to the word line WL.

Embodiments of the memory circuits disclosed above may achieve advantages, including reducing the standby leakage from SRAM circuits. Transistors may be formed in dummy regions on the edges of SRAM arrays and used to SRAM cells to power supply voltages Vss (which may be electrical grounds), which may reduce standby leakage efficiently without using additional chip area or process steps. The transistors in the dummy regions may be seen as resistances when cut off by the controlling word lines. Standby leakage of SRAM circuits in the interior of the SRAM array to Vss through the transistors in the dummy regions may be reduced by about 70% in comparison to a design without transistors in the dummy regions connecting to Vss. Embodiments of SRAM array designs with transistors in the dummy regions may achieve better results without impacting read/write ability due to shorter bit-line loading.

In accordance with an embodiment, a semiconductor device includes: a plurality of first memory cells in a memory region, each of the plurality of the first memory cells including a static random access memory (SRAM) cell, the static random access memory cell including a first pull-down transistor and a second pull-down transistor, the plurality of the first memory cells including a first memory cell; and a first cut-off transistor in a dummy region, the dummy region being adjacent to the memory region, a first source/drain region of the first pull-down transistor in the first memory cell being electrically coupled to a first source/drain region of the first cut-off transistor, wherein a second source/drain region of the first cut-off transistor is electrically coupled to a power supply voltage. In an embodiment, the power supply voltage is ground. In an embodiment, a first source/drain region of the second pull-down transistor is electrically coupled to the first source/drain region of the cut-off transistor. In an embodiment, a gate electrode of the first cut-off transistor is electrically coupled to a word line. In an embodiment, the semiconductor device further includes: a second cut-off transistor in the dummy region, a first source/drain region of the second pull-down transistor in the first memory cell being electrically coupled to a first source/drain region of the second cut-off transistor, wherein a second source/drain region of the second cut-off transistor is electrically coupled to the power supply voltage. In an embodiment, a gate electrode of the first cut-off transistor and a gate electrode of the second cut-off transistor are electrically coupled to a word line. In an embodiment, the plurality of first memory cells includes a second memory cell, the first memory cell and the second memory cell being electrically coupled to a same bit line, wherein the first pull-down transistor of the second memory cell is electrically coupled to the first source/drain of the first cut-off transistor. In an embodiment, the plurality of first memory cells includes a second memory cell, the first memory cell and the second memory cell being electrically coupled to a same bit line, further including: a second cut-off transistor in the dummy region, a first source/drain region of the second pull-down transistor in the second memory cell being electrically coupled to a first source/drain region of the second cut-off transistor, wherein a second source/drain region of the second cut-off transistor is electrically coupled to the power supply voltage. In an embodiment, a gate electrode of the first cut-off transistor and the second cut-off transistor are coupled to a same control line.

In accordance with another embodiment, a semiconductor device includes: a first memory cell in a memory array, the first memory cell including a static random access memory (SRAM) cell having a first pull-down transistor and a second pull-down transistor; a dummy region along a boundary of the memory array; a first cut-off transistor in the dummy region, the first cut-off transistor having a first source/drain electrically coupled to a first source/drain of the first pull-down transistor and a second source/drain electrically coupled to ground; and a well pick-up region adjacent the dummy region, wherein the dummy region is interposed between the well pick-up region and the memory array. In an embodiment, the first memory cell is a closest memory cell of memory cells connected to a same bit line to the dummy region. In an embodiment, the semiconductor device further includes: a second memory cell in the memory array, wherein the first memory cell and the second memory cell are electrically coupled to a same bit line, wherein the first cut-off transistor is not electrically interposed between the second memory cell and ground. In an embodiment, the semiconductor device of further includes: a second memory cell in the memory array, wherein the first memory cell and the second memory cell are electrically coupled to a same bit line, wherein a first source/drain of the first pull-down transistor of the second memory cell is electrically coupled to the first cut-off transistor. In an embodiment, a gate electrode of the first cut-off transistor and a gate electrode of the second cut-off transistor are electrically coupled to a control line different than a word line. In an embodiment, the semiconductor device further includes: a second cut-off transistor, the second cut-off transistor having a first source/drain electrically coupled to a first source/drain of the second pull-down transistor and having a second source/drain electrically coupled to ground. In an embodiment, a gate electrode of the first cut-off transistor and a gate electrode of the second cut-off transistor are electrically coupled to a word line. In an embodiment, the semiconductor further includes: a second memory cell in the memory array, wherein the first memory cell and the second memory cell are electrically coupled to a same bit line, wherein a first source/drain of the first pull-down transistor of the second memory cell is electrically coupled to the first source/drain of the first cut-off transistor; and a second cut-off transistor, the second cut-off transistor having a first source/drain electrically coupled to a first source/drain of the second pull-down transistor of the first memory cell and to a first source/drain of the second pull-down transistor of the second memory cell, the second cut-off transistor having a second source/drain electrically coupled to ground. In an embodiment, a gate electrode of the first cut-off transistor and a gate electrode of the second cut-off transistor are electrically coupled to a control line different than a word line.

In accordance with yet another embodiment, a method of forming a semiconductor device includes forming a memory cell in a memory array, including: forming a first pull-down transistor and a second pull-down transistor in a memory region of the memory array; forming a first cut-off transistor in a dummy region of the memory array; electrically connecting a first source/drain of the first cut-off transistor to a source/drain of the first pull-down transistor; and electrically connecting a second source/drain of the first cut-off transistor to a power supply voltage. In an embodiment, the method further includes: forming a second cut-off transistor in the dummy region of the memory array; electrically connecting a first source/drain of the second cut-off transistor to a source/drain of the second pull-down transistor; and electrically connecting a second source/drain of the second cut-off transistor to the power supply voltage.

In accordance with yet another embodiment, a semiconductor device includes: a first memory cell, the first memory cell including a first transistor; and a dummy region adjacent to the first memory cell, the dummy region including a cut-off transistor, the cut-off transistor having a first terminal electrically coupled to a second terminal of the first transistor, the cut-off transistor having a third terminal electrically coupled to ground. In an embodiment, the semiconductor device further includes a word line, the word line being electrically coupled to the first memory cell, wherein a gate of the cut-off transistor is electrically coupled to the word line. In an embodiment, the semiconductor device further includes: a word line, the word line being electrically coupled to the first memory cell; and a control line, the control line being separate from the word line, wherein a gate of the cut-off transistor is electrically coupled to the control line. In an embodiment, the cut-off transistor is a two-fin FinFET. In an embodiment, the dummy region has a width of three dummy gate pitches. In an embodiment, the dummy region includes a first gate electrode and a second gate electrode, the first gate electrode being between the second gate electrode and the first memory cell, and wherein a portion of the first gate electrode is part of the cut-off transistor. In an embodiment, the dummy region includes a first gate electrode and a second gate electrode, the first gate electrode being between the second gate electrode and the first memory cell, and wherein a portion of the second gate electrode is part of the cut-off transistor.

In accordance with yet another embodiment, a semiconductor device includes: a plurality of memory cells in a memory region, wherein a first memory cell of the plurality of memory cells includes a first pull-down (PD) transistor and a second PD transistor; and a first cut-off transistor in a dummy region, the dummy region being adjacent to the memory region, the first cut-off transistor having a first terminal and a second terminal, wherein the first terminal is electrically coupled to a fourth terminal of the first PD transistor, and wherein the second terminal is electrically coupled to a first node of a power supply voltage. In an embodiment, the first terminal of the first cut-off transistor is electrically coupled to a fifth terminal of the second PD transistor. In an embodiment, a second memory cell of the plurality of memory cells includes a third PD transistor and a fourth PD transistor, a sixth terminal of the third PD transistor and a seventh terminal of the fourth PD transistor being electrically coupled to the first terminal of the first cut-off transistor. In an embodiment, the semiconductor device further includes a first fin and a second fin, the first fin and the second fin extending across an interface of the memory region with the dummy region, the second fin being separate from the first fin, wherein the first cut-off transistor includes a first portion of the first fin and a second portion of the second fin. In an embodiment, the first PD transistor includes a third portion of the first fin and a fourth portion of the second fin. In an embodiment, the semiconductor device further includes a second cut-off transistor in the dummy region, the second cut-off transistor having a fifth terminal and a sixth terminal, wherein the fourth terminal is electrically coupled to a seventh terminal of the second PD transistor, and wherein the sixth terminal is electrically coupled to a second node of the power supply voltage. In an embodiment, the semiconductor device further includes: a third fin and a fourth fin, the third fin and the fourth fin extending across the interface of the memory region with the dummy region, the third fin being separate from the first fin and the second fin, the fourth fin being separate from the first fin, the second fin, and the third fin, wherein the second cut-off transistor includes a fifth portion of the third fin and a sixth portion of the fourth fin. In an embodiment, the second PD transistor includes a seventh portion of the third fin and an eighth portion of the fourth fin.

In accordance with yet another embodiment, a memory device includes: a dummy region, the dummy region including a first cut-off transistor and a second cut-off transistor, wherein a first terminal of the first cut-off transistor is electrically coupled to ground and a second terminal of the second cut-off transistor is electrically coupled to ground; and a memory region, the memory region being adjacent to the dummy region, the memory region including: a first memory cell, the first memory cell including a first pull-down (PD) transistor, wherein a third terminal of the first PD transistor is electrically coupled to a fourth terminal of the first cut-off transistor; and a second memory cell, the second memory cell including a second PD transistor, wherein a fifth terminal of the second PD transistor is electrically coupled to a sixth terminal of the second cut-off transistor. In an embodiment, the first memory cell and the second memory cell are separate memory cells. In an embodiment, the first memory cell and the second memory cell are the same memory cell. In an embodiment, the memory device further includes word line, the word line being coupled to the first memory cell and the second memory cell, wherein a seventh terminal of the first cut-off transistor and an eighth terminal of the second cut-off transistor are coupled to the word line. In an embodiment, the memory device further includes: a word line, the word line being coupled to the first memory cell and the second memory cell; and a control line, the control line being separate from the word line, wherein a seventh terminal of the first cut-off transistor and an eighth terminal of the second cut-off transistor are coupled to the control line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a first memory cell, the first memory cell comprising a first transistor; and
a dummy region adjacent to the first memory cell, the dummy region comprising a cut-off transistor, the cut-off transistor having a first terminal electrically coupled to a second terminal of the first transistor, the cut-off transistor having a third terminal electrically coupled to ground.

2. The semiconductor device of claim 1, further comprising a word line, the word line being electrically coupled to the first memory cell, wherein a gate of the cut-off transistor is electrically coupled to the word line.

3. The semiconductor device of claim 1, further comprising:
a word line, the word line being electrically coupled to the first memory cell; and
a control line, the control line being separate from the word line, wherein a gate of the cut-off transistor is electrically coupled to the control line.

4. The semiconductor device of claim 1, wherein the cut-off transistor is a two-fin FinFET.

5. The semiconductor device of claim 1, wherein the dummy region has a width of three dummy gate pitches.

6. The semiconductor device of claim 1, wherein the dummy region comprises a first gate electrode and a second gate electrode, the first gate electrode being between the second gate electrode and the first memory cell, and wherein a portion of the first gate electrode is part of the cut-off transistor.

7. The semiconductor device of claim 1, wherein the dummy region comprises a first gate electrode and a second gate electrode, the first gate electrode being between the second gate electrode and the first memory cell, and wherein a portion of the second gate electrode is part of the cut-off transistor.

8. A semiconductor device comprising:
a plurality of memory cells in a memory region, wherein a first memory cell of the plurality of memory cells comprises a first pull-down (PD) transistor and a second PD transistor; and
a first cut-off transistor in a dummy region, the dummy region being adjacent to the memory region, the first cut-off transistor having a first terminal and a second terminal, wherein the first terminal is electrically coupled to a fourth terminal of the first PD transistor, and wherein the second terminal is electrically coupled to a first node of a power supply voltage.

9. The semiconductor device of claim 8, wherein the first terminal of the first cut-off transistor is electrically coupled to a fifth terminal of the second PD transistor.

10. The semiconductor device of claim 9, wherein a second memory cell of the plurality of memory cells comprises a third PD transistor and a fourth PD transistor, a sixth terminal of the third PD transistor and a seventh terminal of the fourth PD transistor being electrically coupled to the first terminal of the first cut-off transistor.

11. The semiconductor device of claim 8, further comprising a first fin and a second fin, the first fin and the second fin extending across an interface of the memory region with the dummy region, the second fin being separate from the first fin, wherein the first cut-off transistor comprises a first portion of the first fin and a second portion of the second fin.

12. The semiconductor device of claim 11, wherein the first PD transistor comprises a third portion of the first fin and a fourth portion of the second fin.

13. The semiconductor device of claim 12, further comprising a second cut-off transistor in the dummy region, the second cut-off transistor having a fifth terminal and a sixth terminal, wherein the fourth terminal is electrically coupled to a seventh terminal of the second PD transistor, and wherein the sixth terminal is electrically coupled to a second node of the power supply voltage.

14. The semiconductor device of claim 13, further comprising:
a third fin and a fourth fin, the third fin and the fourth fin extending across the interface of the memory region with the dummy region, the third fin being separate from the first fin and the second fin, the fourth fin being separate from the first fin, the second fin, and the third fin, wherein the second cut-off transistor comprises a fifth portion of the third fin and a sixth portion of the fourth fin.

15. The semiconductor device of claim 14, wherein the second PD transistor comprises a seventh portion of the third fin and an eighth portion of the fourth fin.

16. A memory device comprising:
a dummy region, the dummy region comprising a first cut-off transistor and a second cut-off transistor, wherein a first terminal of the first cut-off transistor is electrically coupled to ground and a second terminal of the second cut-off transistor is electrically coupled to ground; and
a memory region, the memory region being adjacent to the dummy region, the memory region comprising:
a first memory cell, the first memory cell comprising a first pull-down (PD) transistor, wherein a third terminal of the first PD transistor is electrically coupled to a fourth terminal of the first cut-off transistor; and
a second memory cell, the second memory cell comprising a second PD transistor, wherein a fifth terminal of the second PD transistor is electrically coupled to a sixth terminal of the second cut-off transistor.

17. The memory device of claim 16, wherein the first memory cell and the second memory cell are separate memory cells.

18. The memory device of claim 16, wherein the first memory cell and the second memory cell are the same memory cell.

19. The memory device of claim 16, further comprising a word line, the word line being coupled to the first memory cell and the second memory cell, wherein a seventh terminal of the first cut-off transistor and an eighth terminal of the second cut-off transistor are coupled to the word line.

20. The memory device of claim 16, further comprising:
a word line, the word line being coupled to the first memory cell and the second memory cell; and
a control line, the control line being separate from the word line, wherein a seventh terminal of the first cut-off transistor and an eighth terminal of the second cut-off transistor are coupled to the control line.

* * * * *